(12) United States Patent
Kim et al.

(10) Patent No.: US 11,728,347 B2
(45) Date of Patent: Aug. 15, 2023

(54) METHOD OF MANUFACTURING AN INTEGRATED CIRCUIT DEVICE

(71) Applicant: SAMSUNG ELECTRONICS CO., LTD., Suwon-si (KR)

(72) Inventors: Weonhong Kim, Suwon-si (KR); Pilkyu Kang, Suwon-si (KR); Yuichiro Sasaki, Suwon-si (KR); Sungkeun Lim, Suwon-si (KR); Yongho Ha, Suwon-si (KR); Sangjin Hyun, Suwon-si (KR); Kughwan Kim, Suwon-si (KR); Seungha Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/494,275

(22) Filed: Oct. 5, 2021

(65) Prior Publication Data
US 2022/0028895 A1 Jan. 27, 2022

Related U.S. Application Data

(62) Division of application No. 16/807,410, filed on Mar. 3, 2020, now Pat. No. 11,177,286.

(30) Foreign Application Priority Data

May 20, 2019 (KR) .................. 10-2019-0059129

(51) Int. Cl.
*H01L 27/12* (2006.01)
*H01L 21/762* (2006.01)
(Continued)

(52) U.S. Cl.
CPC .... *H01L 27/1203* (2013.01); *H01L 21/76224* (2013.01); *H01L 27/0203* (2013.01); *H01L 27/02* (2013.01); *H01L 29/78* (2013.01)

(58) Field of Classification Search
CPC ........... H01L 27/1203; H01L 21/76224; H01L 27/0203; H01L 27/02; H01L 27/12; H01L 29/78; H01L 21/027; H01L 21/311
(Continued)

(56) References Cited

U.S. PATENT DOCUMENTS 6,121,659 A 9/2000 Christensen et al.
6,645,796 B2 11/2003 Christensen et al.
(Continued)

*Primary Examiner* — Thinh T Nguyen
(74) *Attorney, Agent, or Firm* — Lee IP Law, P.C.

(57) ABSTRACT

An integrated circuit device includes an embedded insulation layer, a semiconductor layer on the embedded insulation layer, the semiconductor layer having a main surface, and a plurality of fin-type active areas protruding from the main surface to extend in a first horizontal direction and in parallel with one another, a separation insulation layer separating the semiconductor layer into at least two element regions adjacent to each other in a second horizontal direction intersecting the first horizontal direction, source/drain regions on the plurality of fin-type active areas, a first conductive plug on and electrically connected to the source/drain regions, a buried rail electrically connected to the first conductive plug while penetrating through the separation insulation layer and the semiconductor layer, and a power delivery structure arranged in the embedded insulation layer, the power delivery structure being in contact with and electrically connected to the buried rail.

8 Claims, 39 Drawing Sheets

(51) Int. Cl.
*H01L 27/02* (2006.01)
*H01L 29/78* (2006.01)

(58) Field of Classification Search
USPC .......................... 438/152, 155; 257/330, 774
See application file for complete search history.

(56) References Cited

U.S. PATENT DOCUMENTS

| | | |
|---|---|---|
| 6,667,518 B2 | 12/2003 | Christensen et al. |
| 8,592,988 B2 | 11/2013 | Lee et al. |
| 8,928,127 B2 | 1/2015 | Chen et al. |
| 9,455,187 B1 | 9/2016 | Gambino et al. |
| 2011/0260248 A1 | 10/2011 | Smeys et al. |
| 2012/0292777 A1 | 11/2012 | Lotz |
| 2018/0145030 A1* | 5/2018 | Beyne et al. ....... H01L 23/5286 |

\* cited by examiner

X1 - X1'

X1 - X1'

X1 - X1'

Y1 - Y1'

X1 - X1'

X1 - X1'

Y1 - Y1'

X1 - X1'

Y1 - Y1'

X1 - X1'

Y1 - Y1'

Y1 - Y1'

X1 - X1'

X1 - X1'

X1 - X1'

X1 - X1'

X1 - X1'

X2 - X2'

Y1 - Y1'

X1 - X1'

X2 - X2'

Y1 - Y1'

METHOD OF MANUFACTURING AN INTEGRATED CIRCUIT DEVICE

CROSS-REFERENCE TO RELATED APPLICATION

This is a division of U.S. patent application Ser. No. 16/807,410 filed Mar. 3, 2020, which is incorporated by reference herein in its entirety.

Korean Patent Application No. 10-2019-0059129, filed on May 20, 2019, in the Korean Intellectual Property Office, and entitled: "Integrated Circuit Device and Method of Manufacturing the Same," is incorporated by reference herein in its entirety.

BACKGROUND

1. Field

The present disclosure relates to an integrated circuit device and a method of manufacturing the integrated circuit device, and in particular, to an integrated circuit device having a power delivery network and a method of manufacturing the integrated circuit device.

2. Description of the Related Art

As electronic technology has developed, an integrated circuit device has been down-scaled. An integrated circuit device that is highly integrated has to have a lot of wiring layers arranged within a small area while stably ensuring insulation distances among the wiring layers.

SUMMARY

According to an aspect of embodiments, there is provided an integrated circuit device including an embedded insulation layer, a semiconductor layer arranged on the embedded insulation layer, the semiconductor layer having a main surface from which a plurality of fin-type active areas protrude, wherein the plurality of fin-type active areas extend in parallel with one another in a first horizontal direction in a plurality of element regions defined by a separation insulation layer, source/drain regions located on the plurality of fin-type active areas, a first conductive plug located on the source/drain regions and electrically connected to the source/drain regions; a buried rail electrically connected to the first conductive plug while penetrating through the separation insulation layer and the semiconductor layer, and a power delivery structure arranged in the embedded insulation layer and being in contact with the buried rail to be electrically connected to the buried rail.

According to an aspect of embodiments, there is also provided an integrated circuit device including an embedded insulation layer, a semiconductor layer arranged on the embedded insulation layer, the semiconductor layer having a plurality of fin-type active areas that protrude therefrom, wherein the plurality of fin-type active areas extend in parallel with one another in a first horizontal direction in a plurality of element regions defined by a separation insulation layer, a gate structure extending on the semiconductor layer in a second horizontal direction intersecting with the first horizontal direction, the gate structure including a stack structure including a gate insulation layer and a gate line, a plurality of source/drain regions located on the plurality of fin-type active areas at opposite sides of the gate structure, a first conductive plug located on the plurality of source/drain regions, the first conductive plug being electrically connected to at least some of the plurality of source/drain regions, a buried rail electrically connected to the first conductive plug while penetrating through the separation insulation layer and the semiconductor layer, a power delivery structure arranged in the embedded insulation layer and being in contact with the buried rail to be electrically connected to the buried rail, a rear wiring structure arranged on a lower surface of the embedded insulation layer, which is opposite the semiconductor layer, the rear wiring structure being electrically connected to the power delivery structure, and a rear inter-wire insulation layer partially surrounding the rear wiring structure.

According to an aspect of embodiments, there is also provided a method of manufacturing an integrated circuit including preparing a semiconductor-on-insulator (SOI) substrate on which a base substrate layer, an embedded insulation layer, and a semiconductor layer are sequentially stacked, forming a deep trench that defines a plurality of element regions, by partially removing the semiconductor layer, forming a preliminary separation insulation layer that is filled in the deep trench, forming a buried rail hole that penetrates through the preliminary separation insulation layer and the semiconductor layer, a buried rail partially filled in a lower portion of the buried rail hole, and a preliminary cover insulation layer filled in an upper portion of the buried rail hole, exposing the embedded insulation layer by removing the base substrate layer, and forming a power delivery structure in the embedded insulation layer, the power delivery structure being in contact with the buried rail.

According to an aspect of embodiments, there is also provided a method of manufacturing an integrated circuit device, including preparing a semiconductor-on-insulator (SOI) substrate, on which a base substrate layer, an embedded insulation layer, and a semiconductor layer are sequentially stacked, forming a plurality of preliminary fin-type active areas by partially etching the semiconductor layer, and a preliminary isolation layer covering the plurality of preliminary fin-type active areas on the semiconductor layer, the plurality of preliminary fin-type active areas protruding perpendicularly from a main surface of the semiconductor layer and extending in a first horizontal direction, forming a deep trench by partially removing the preliminary isolation layer and the semiconductor layer, the deep trench defining a plurality of element regions, and forming a preliminary separation insulation layer that is filled in the deep trench, forming a buried rail hole that penetrates through the preliminary separation insulation layer and the semiconductor layer, a buried rail partially filled in a lower portion of the buried rail hole, and a preliminary cover insulation layer filled in an upper portion of the buried rail hole, exposing the embedded insulation layer by removing the base substrate layer, forming a power delivery hole by partially removing the embedded insulation layer, wherein the embedded insulation layer is partially removed by using a mask pattern as an etching mask, wherein the mask pattern is obtained by a photolithography process in which the buried rail functions as an alignment key, and forming a power delivery structure that is filled in the power delivery hole, the power delivery structure being in contact with the buried rail to be electrically connected to the buried rail.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1A:
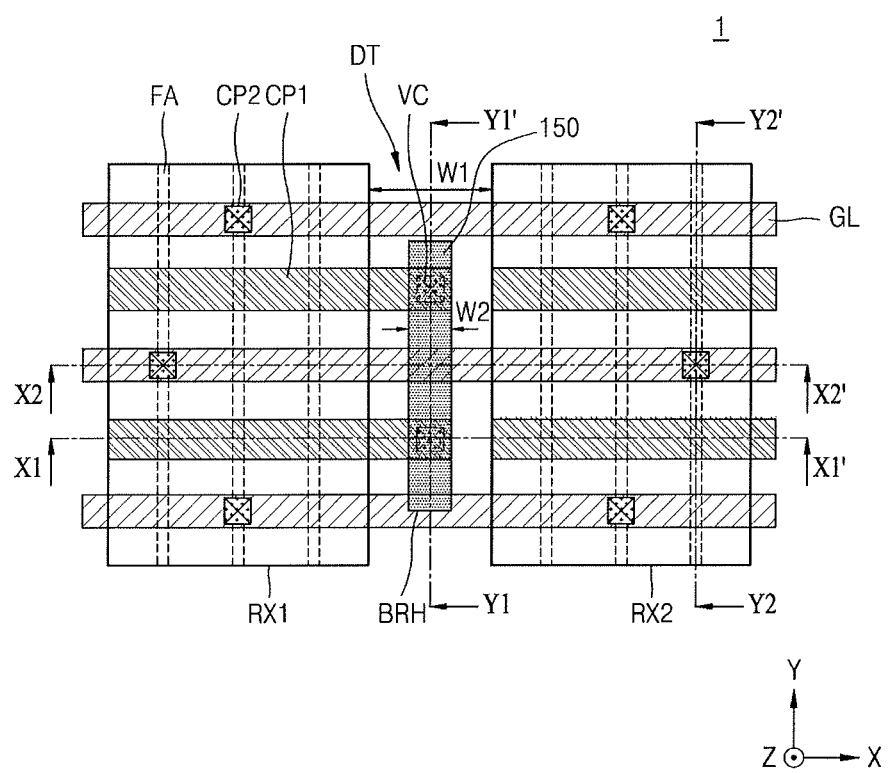
FIGS. 1A to 1C illustrate respectively a plane layout diagram and cross-sectional views of an integrated circuit device according to an embodiment.
Figure 1B:
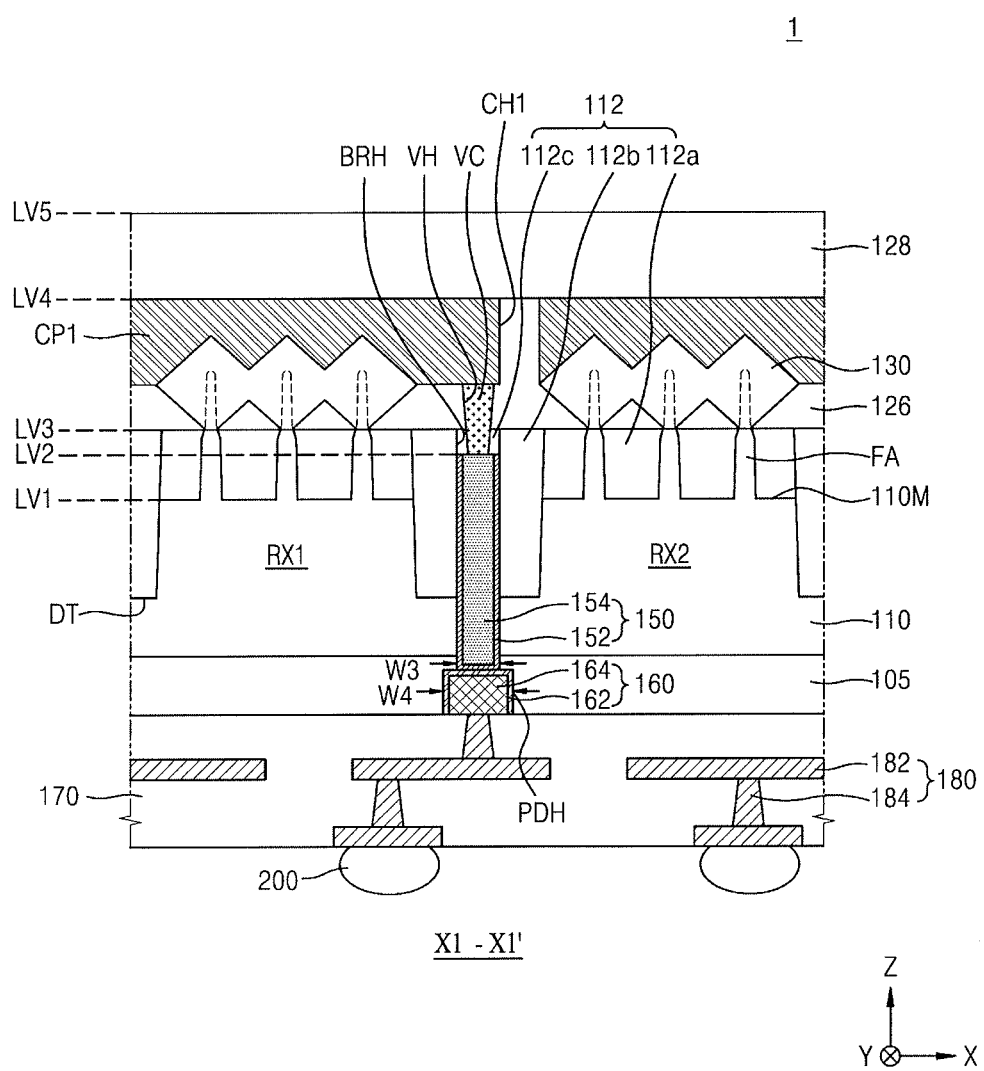
Figure 1C:
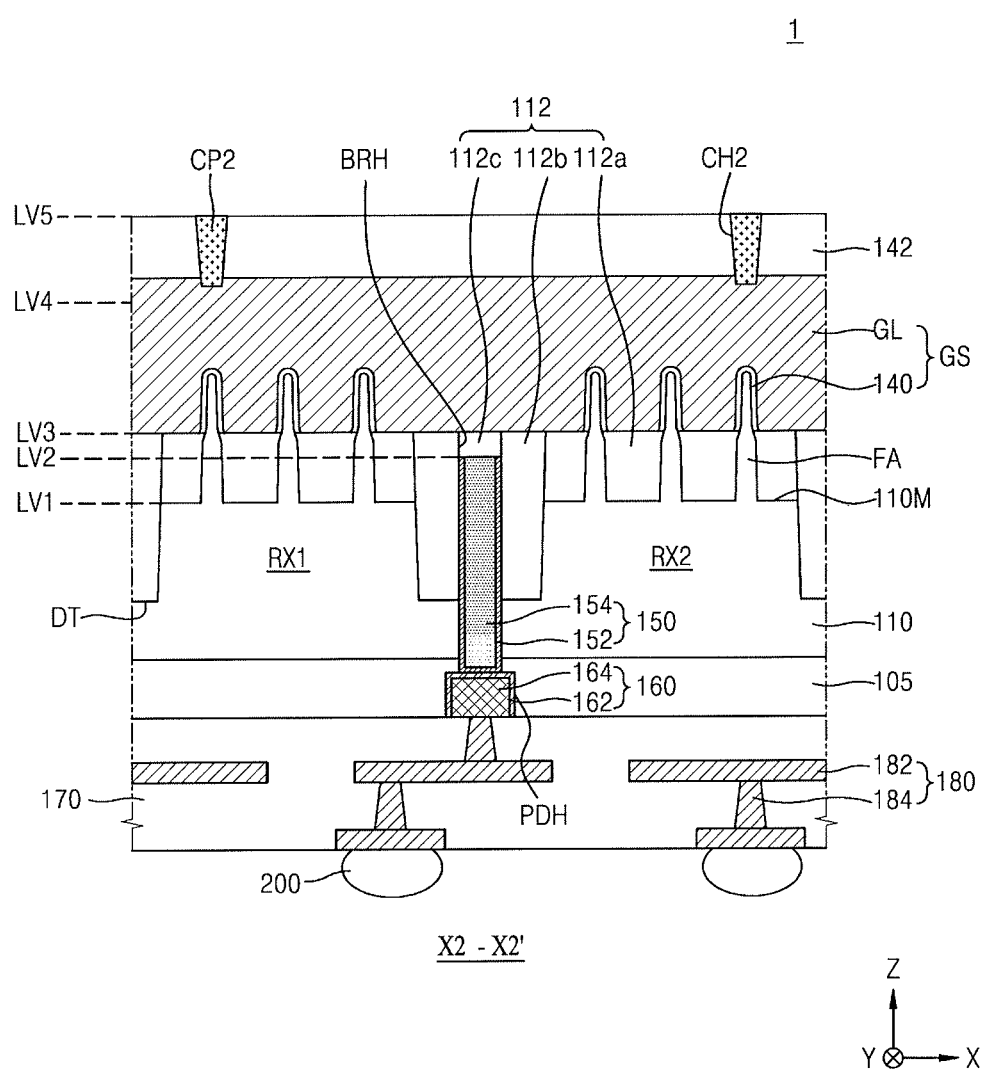

FIG. 1A is a plane layout diagram of an integrated circuit device 1 according to an embodiment. FIGS. 1B and 1C are cross-sectional views along lines X1-X1' and X2-X2' of FIG. 1A, respectively.

Referring to FIGS. 1A to 1C, the integrated circuit device 1 may include a fin field effect transistor (FinFET) device. The FinFET device may configure a logic cell. The logic cell may include a plurality of circuit elements, e.g., a transistor, a resistor, etc., and may have various structures. The logic cell may be, e.g., an AND, a NAND, an OR, NOR, an exclusive OR (XOR), an exclusive NOR (XNOR), an inverter (INV), an adder (ADD), a buffer (BUF), a delay (ELY), a filter (FIL), a multiplexer (MXT/MXIT), an OR/AND/INVERTER (OAI), an AND/OR (AO), an AND/OR/INVERTER (AOI), a D flip-flop, a reset flip-flop, a master-slaver flip-flop, a latch, etc., and the logic cell may include standard cells performing desired logical functions, e.g., a counter, a buffer, etc.

The integrated circuit device 1 may include a semiconductor layer 110 having a plurality of element regions including a first element region RX1 and a second element region RX2, and a plurality of fin-type active areas FA protruding upward from the first element region RX1 and the second element region RX2 in the semiconductor layer 110. The semiconductor layer 110 may have a main surface 110M extending horizontally (X-Y plane direction) in a first vertical level LV1. The plurality of fin-type active areas FA may protrude perpendicularly (Z-direction) upward from the main surface 110M of the semiconductor layer 110. The semiconductor layer 110 may include a semiconductor material, e.g., Si, or a compound semiconductor material, e.g., SiGe, SiC, GaAs, InAs, or InP. The semiconductor layer 110 may include a conductive region, e.g., a well doped with impurities or a structure doped with impurities.

The plurality of fin-type active areas FA are arranged in a first horizontal direction (X direction) with a constant pitch therebetween, and may extend in a second horizontal direction (Y direction) in parallel with one another. A separation insulation structure 112 may be provided in a region between the fin-type active areas FA. An isolation layer 112a of the separation insulation structure 112 may cover opposite side walls on lower portions of the plurality of fin-type active areas FA, e.g., the isolation layer 112a may separate every two adjacent fin-type active areas FA from each other. In the first element region RX1 and the second element region RX2, the plurality of fin-type active areas FA may protrude above the isolation layer 112a in fin shapes.

A deep trench DT may be formed in the semiconductor layer 110 around the first element region RX1 and the second element region RX2, and the separation insulation structure 112 may be formed in the deep trench DT. A separation insulation layer 112b of the separation insulation structure 112 may fill the deep trench DT.

A buried rail 150 may be arranged in a buried rail hole BRH, which penetrates through the separation insulation layer 112b and the semiconductor layer 110 and extends to an embedded insulation layer 105. The buried rail 150 may include a buried barrier layer 152 and a buried conductive layer 154. The buried barrier layer 152 may conformally cover an internal wall and a bottom surface of a lower portion of the buried rail hole BRH, and the buried conductive layer 154 may fill the lower portion of the buried rail hole BRH while covering the buried barrier layer 152. The lower portion of the buried rail hole BRH is filled with the buried rail 150 and a remaining part, i.e., an upper portion above the buried rail 150, of the buried rail hole BRH may be filled with the separation insulation structure 112. That is, a cover insulation layer 112c of the separation insulation structure 112 may fill the upper portion of the buried rail hole BRH, i.e., the cover insulation layer 112c may be the upper portion above the buried rail 150 that fills the top of the buried rail hole BRH.

As illustrated in FIG. 1A, a first width W1 of the deep trench DT between the first and second element regions RX1 and RX2, e.g., as measured between facing sidewalls of the deep trench DT in the first horizontal direction (in the X direction), which is filled with the separation insulation layer 112b, may be greater than a second width W2 of the buried rail hole BRH, e.g., as measured between facing sidewalls of the buried rail hole BRH in the first horizontal direction (in the X direction), and which accommodates the buried rail 150 extending through the separation insulation layer 112b. Therefore, the integrated circuit device 1 may not need to have an additional area, in which the buried rail 150 is arranged.

The separation insulation structure 112 may include, e.g., a silicon oxide layer, but is not limited thereto. In some example embodiments, at least a part of the separation insulation structure 112 may include a first insulating liner, a second insulating liner, and a buried insulation layer sequentially stacked on the semiconductor layer 110. The isolation layer 112a, the separation insulation layer 112b, and the cover insulation layer 112c included in the separation insulation structure 112 may be separately formed from one another, and there may be an interface between the isolation layer 112a and the separation insulation layer 112b and/or between the separation insulation layer 112b and the cover insulation layer 112c.

Referring to FIGS. 1A and 1C, a plurality of gate structures GS may extend on the semiconductor layer 110 in the first horizontal direction (X direction) that crosses the plurality of fin-type active areas FA. The plurality of gate structures GS may have the same width as one another in the second horizontal direction (Y direction) and may be arranged, e.g., spaced apart, in the second horizontal direction (Y direction) with constant pitch therebetween. As illustrated in FIG. 2, each of the plurality of gate structures GS may have a stack structure including a gate insulation layer 140 and a gate line GL. In some example embodiments, the gate insulation layer 140 may cover a lower surface and opposite side walls of the gate line GL. An upper surface of each gate structure GS may be covered by a gate capping layer 142.

The plurality of gate structures GS may extend while covering an upper surface and opposite side walls of each of the plurality of fin-type active areas FA and an upper surface of the separation insulation structure 112. A plurality of MOS transistors may be formed along the plurality of gate structures GS in the first element region RX1 and the second element region RX2. Each of the plurality of MOS transistors may have a three-dimensional (3D) structure, and channels are formed on the upper surface and opposite side walls of each fin-type active area FA.

In some embodiments, at least one of the plurality of gate structures GS may extend along the buried rail 150, e.g., at least one of the plurality of gate structures GS may cross over a top of the buried rail 150. The cover insulation layer 112c may be between the gate line GL of the gate structure GS and the buried rail 150 in order to electrically insulate the gate line GL from the buried rail 150, e.g., the cover insulation layer 112c may cover the entire top of the buried rail 150 facing the gate line GL of the gate structure GS.

In FIGS. 1A and 1C, the plurality of gate structures GS extends in the first horizontal direction (X direction) throughout the first element region RX1 and the second element region RX2, but one or more embodiments are not limited thereto. An extension length of each of the plurality of gate structures GS may vary depending on the logic cell that is to be formed by the FinFET device included in the integrated circuit device 1. For example, some of the plurality of gate structures GS may extend in the first horizontal direction (X direction) in the first element region RX1 but may not extend to the second element region RX2, and some other of the plurality of gate structures GS may extend in the first horizontal direction (X direction) in the second element region RX2 but may not extend to the first element region RX1.

A plurality of insulation spacers 120 (FIG. 17C) may cover opposite side walls of the plurality of gate structures GS. That is, opposite side walls of one gate structure GS may be covered by a pair of insulation spacers 120. The plurality of insulation spacers 120 extend as lines in the first horizontal direction (X direction) together with the plurality of gate structures GS. The plurality of insulation spacers 120 may each include, e.g., a silicon nitride layer, a SiOCN layer, a SiCN layer, or a combination thereof.

A plurality of source/drain regions 130 may be formed on opposite sides of the gate structures GS in the plurality of fin-type active areas FA. In some embodiments, the plurality of source/drain regions 130 may each have an embedded SiGe structure including a plurality of SiGe layers that are epitaxially grown. The plurality of SiGe layers may have different Ge contents. In some embodiments, the plurality of source/drain regions 130 may each include an epitaxially grown Si layer or an epitaxially grown SiC layer. The source/drain region 130 and the gate structure GS may be insulated from each other by the insulation spacer 120 disposed therebetween.

A first inter-gate insulation layer 126 and a second inter-gate insulation layer 128 may be arranged between the plurality of gate structures GS. The first inter-gate insulation layer 126 may have a via hole VH filled with a via contact VC and a first contact hole CH1 filled with a first conductive plug CP1.

The first conductive plug CP1 may be electrically connected to the source/drain region 130 by at least partially contacting the upper surface of the source/drain region 130. The via contact VC may electrically connect the first conductive plug CP1 to the buried rail 150. An upper surface of the via contact VC may be in, e.g., direct, contact with a lower surface of the first conductive plug CP1, and a lower surface of the via contact VC may be in, e.g., direct, contact with an upper surface of the buried rail 150.

The first conductive plug CP1 may be covered by the second inter-gate insulation layer 128. The first and second inter-gate insulation layers 126 and 128 may include, e.g., a silicon oxide layer. The first and second inter-gate insulation layers 126 and 128 may be collectively referred to as inter-gate insulation layers.

A second conductive plug CP2 may fill a second contact hole CH2 penetrating through the gate capping layer 142 and may be electrically connected to the gate line GL. For example, as illustrated in FIG. 1C, a bottom of the second conductive plug CP2 may penetrate into the gate line GL, while top surfaces of the gate capping layer 142 and the second conductive plug CP2 may be level.

The buried rail 150 may extend to the embedded insulation layer 105 after penetrating through the separation insulation layer 112b and the semiconductor layer 110. The buried rail 150 may extend from the semiconductor layer 110 while protruding into the embedded insulation layer 105.

A power delivery structure 160 may be arranged in the embedded insulation layer 105, and the power delivery structure 160 may be in contact with the buried rail 150 to be electrically connected to the buried rail 150. The power delivery structure 160 extends from a lower surface of the embedded insulation layer 105 and fills in a power delivery hole PDH that exposes the buried rail 150. The power delivery structure 160 may include a power delivery barrier layer 162 and a power delivery conductive layer 164. The power delivery barrier layer 162 may conformally cover an internal surface of the power delivery hole PDH, and the power delivery conductive layer 164 may cover the power delivery barrier layer 162 and fill in the power delivery hole PDH.

In some embodiments, at a portion where the buried rail 150 and the power delivery structure 160 are in contact with each other, a third width W3 of the buried rail 150 in the first horizontal direction (X direction) may be less than a fourth width W4 of the power delivery structure 160. As described later, the buried rail 150 is firstly formed, and then the power delivery structure 160 may be formed to be in contact with the buried rail 150. Since the fourth width W4 of the power delivery structure 160 is greater than the third width W3 of the buried rail 150, the buried rail 150 and the power delivery structure 160 may have excellent reliability in electrical connection.

On the lower surface of the embedded insulation layer 105, which is opposite to the upper surface facing the semiconductor layer 110, a rear wiring structure 180 including a rear wiring layer 182 and a rear via plug 184, and a rear inter-wire insulation layer 170 that partially surrounds the rear wiring layer 182 and the rear via plug 184 may be arranged. In an integrated circuit device, between opposite surfaces of the semiconductor layer or the semiconductor substrate, a surface where a transistor, e.g., a FinFET device, is arranged may be referred to as a front surface, and a surface opposite the front surface may be referred to as a rear surface. The rear inter-wire insulation layer 170 and the rear wiring structure 180 may be arranged on a surface opposite to the surface where the plurality of fin-type active areas FA is formed in the semiconductor layer 110. An external connection terminal 200 may be attached to a portion of the rear wiring structure 180, which is exposed through the lower surface of the rear inter-wire insulation layer 170.

When the main surface 110M of the semiconductor layer 110 is at the first vertical level LV1, the upper surface of the buried rail 150 is at the second vertical level LV2 that is higher than the first vertical level LV1, and the upper surface of the separation insulation structure 112 may be at the third vertical level LV3 that is higher than the second vertical level LV2. That is, the upper surface of the buried rail 150 may be at a level between the main surface 110M of the semiconductor layer 110 and the upper surface of the separation insulation structure 112. A lower surface of the via contact VC may be at the second vertical level LV2.

The upper surface of the first conductive plug CP1 may be at a fourth vertical level LV4, and the upper surface of the second conductive plug CP2 may be at a fifth vertical level LV5 that is higher than the fourth vertical level LV4. Therefore, the upper surface of the second conductive plug CP2 may be at a higher level than the upper surface of the first conductive plug CP1.

In the integrated circuit device 1 according to one or more embodiments, the electric power provided through the external connection terminal may be supplied to the source/drain regions 130 via the rear wiring structure 180, the power delivery structure 160, the buried rail 150, and the first conductive plug CP1. The buried rail 150 is arranged in the separation insulation layer 112b that defines the first and second element regions RX1 and RX2, and the power delivery structure 160 and the rear wiring structure 180 are arranged on the rear surface of the semiconductor layer 110. Therefore, the buried rail 150, the power delivery structure 160, and the rear wiring structure 180 may not occupy additional area in the integrated circuit device 1. As such, in the integrated circuit device 1, the rear wiring layer 182 on the rear surface of the semiconductor layer 110, as well as other wiring layers that may be on the front surface of the semiconductor layer 110, may be arranged while having an insulation distance therebetween.

Also, since the upper surface of the second conductive plug CP2 may be at a higher level than the upper surface of the first conductive plug CP1, a degree of freedom in arranging the first conductive plug CP1 and the second conductive plug CP2 may be also improved.

FIGS. 2A to 19D are plane layout diagrams and cross-sectional views illustrating stages in a method of manufacturing an integrated circuit device, according to an embodiment. Lines X1-X1', X2-X2', Y1-Y1', and Y2-Y2' of FIGS. 2A to 19D correspond to lines X1-X1', X2-X2', Y1-Y1', and Y2-Y2' of FIG. 1A.

Figure 2A:
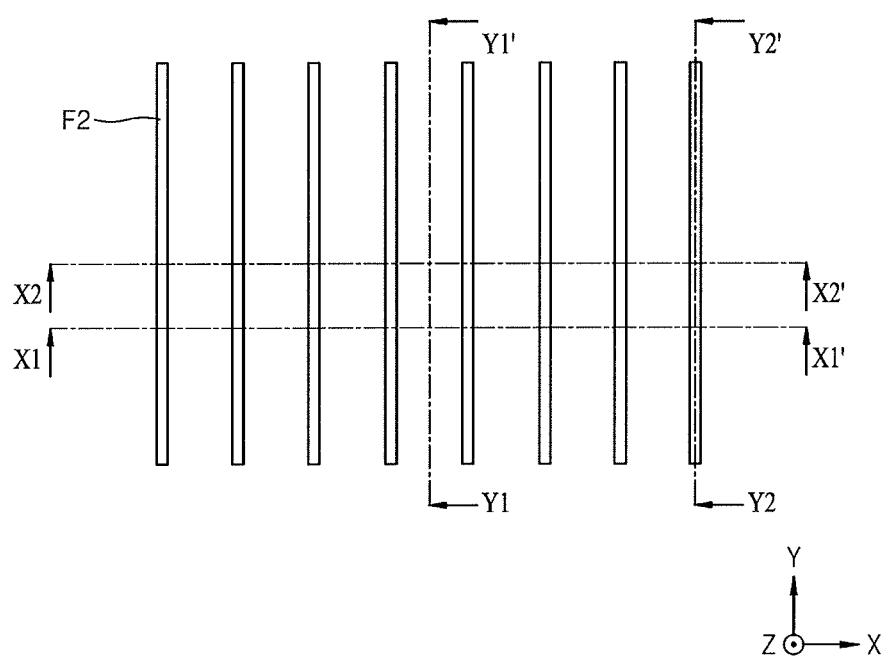
FIGS. 2A to 19D illustrate plane layout diagrams and cross-sectional views of stages in a method of manufacturing an integrated circuit device, according to an embodiment.
Figure 2B:
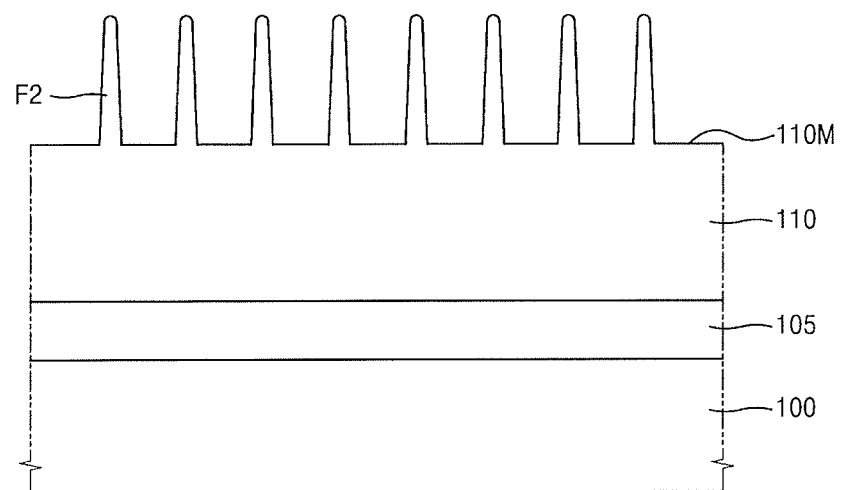
Figure 2B:
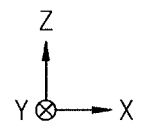
Figure 2C:
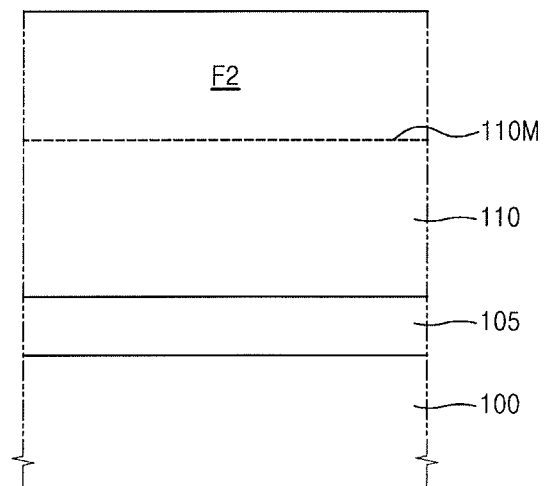
Figure 2C:

FIGS. 2A to 2C are a plane layout diagram and cross-sectional views illustrating a process of forming a plurality of preliminary fin-type active areas F2 according to one or more embodiments. In detail, FIG. 2B is a cross-sectional view taken along line X1-X1' of FIG. 2A, and FIG. 2C is a cross-sectional view taken along line Y1-Y1' of FIG. 2A.

Referring to FIGS. 2A to 2C, a semiconductor-on-insulator (SOI) substrate on which the base substrate layer 100, the embedded insulation layer 105, and the semiconductor layer 110 are sequentially stacked is prepared. Then, the semiconductor layer 110 is partially etched to form a plurality of preliminary fin-type active areas F2 that protrude from the main surface 110M in the vertical direction (Z direction). The preliminary fin-type active areas F2 may be arranged, e.g., spaced apart, in the first horizontal direction (X direction) with constant pitch therebetween, and may extend in the second horizontal direction (Y direction). In some embodiments, the first horizontal direction (X direction) and the second horizontal direction (Y direction) may be perpendicular to each other.

The base substrate layer 100 may include a semiconductor material, e.g., Si or Ge. The embedded insulation layer 105 may include an insulation layer having a composition including semiconductor atoms, an insulation layer including metal oxide, an insulation layer including metal nitride, or a stack structure thereof. For example, the embedded insulation layer 105 may include an insulation layer including one of silicon oxide ($SiO_x$), silicon nitride (SiN), silicon oxynitride (SiON), germanium oxide ($GeO_x$), germanium nitride ($GeN_x$), aluminum oxide ($Al_2O_3$), tantalum oxide ($Ta_2O_5$), hafnium oxide ($HfO_2$), and aluminum nitride (AlN), or a stack structure of at least two insulation layers thereof. The semiconductor layer 110 may include a semiconductor, e.g., Si, or a compound semiconductor, e.g., SiGe, SiC, GaAs, InAs, or InP. The semiconductor layer 110 may include a conductive region, e.g., a well doped with impurities or a structure doped with impurities.

Figure 3A:
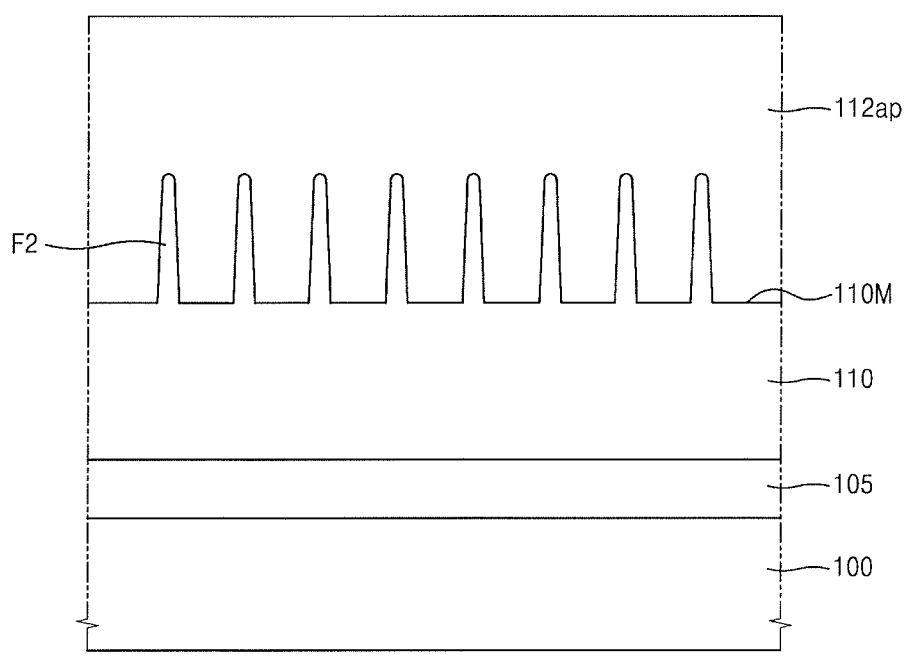
Figure 3A:
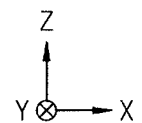
Figure 3B:
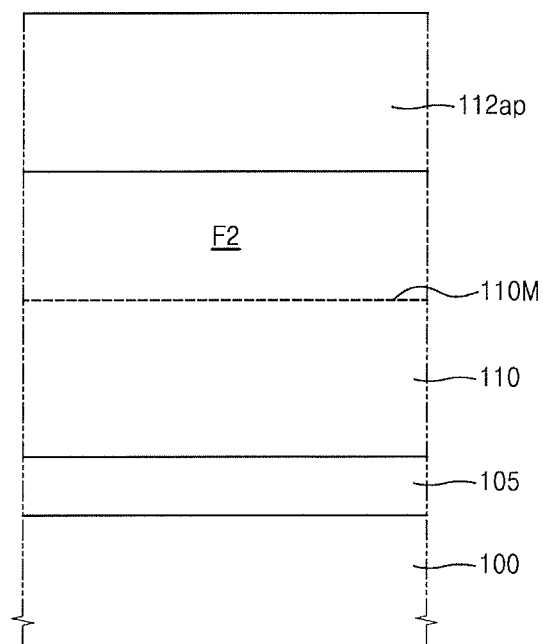
Figure 3B:

FIGS. 3A and 3B are cross-sectional views illustrating a process of forming a preliminary isolation layer 112ap according to one or more embodiments. In detail, FIG. 3A is a cross-sectional view taken along a portion corresponding to X1-X1' in FIG. 2A, and FIG. 3B is a cross-sectional view taken along a portion corresponding to Y1-Y1' in FIG. 2A.

Referring to FIGS. 3A and 3B, the preliminary isolation layer 112ap covering the plurality of preliminary fin-type active areas F2 is formed on the semiconductor layer 110. The preliminary isolation layer 112ap may cover opposite side walls and upper surfaces of the plurality of preliminary fin-type active areas F2. In some embodiments, an upper surface of the preliminary isolation layer 112ap may be located at a higher level than upper ends of the plurality of preliminary fin-type active areas F2.

The preliminary isolation layer 112ap may include, e.g., a silicon oxide layer, but is not limited thereto. In some embodiments, the preliminary isolation layer 112ap may include a first insulating liner, a second insulating liner, and an embedded insulation layer sequentially stacked on the semiconductor layer 110.

Figure 4A:
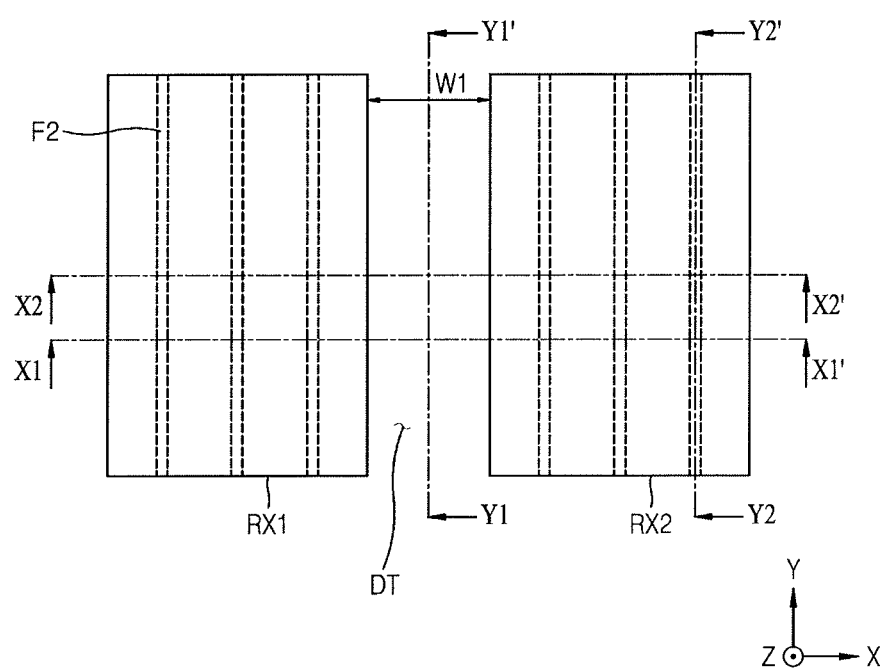
Figure 4B:
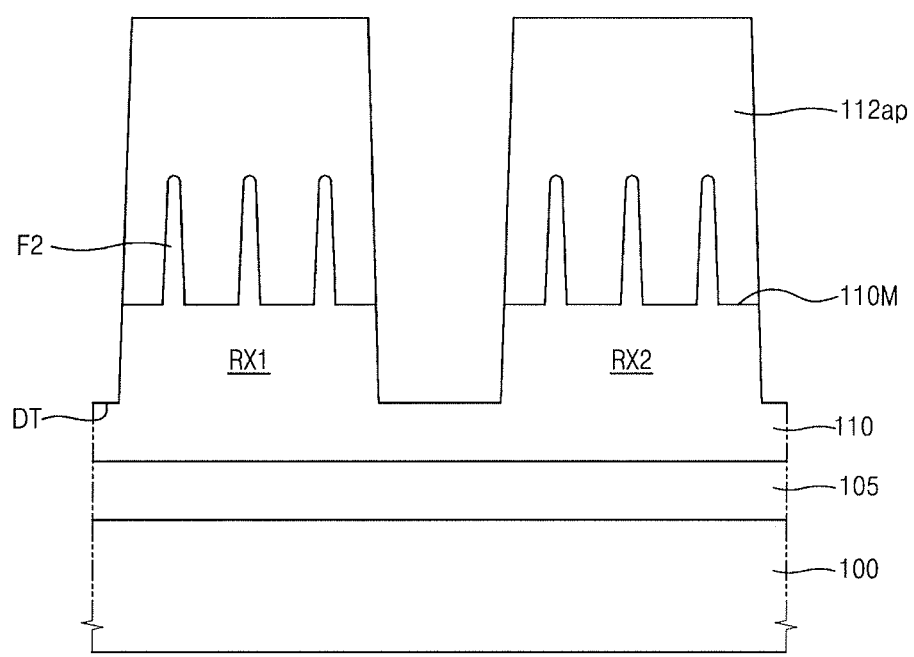
Figure 4C:
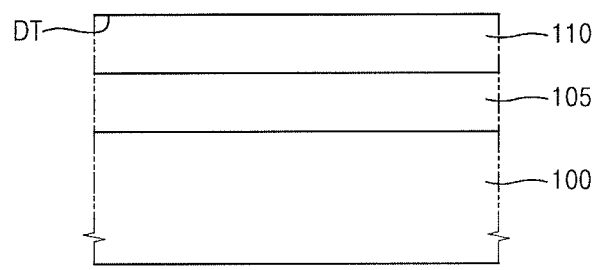
Figure 4C:

FIGS. 4A to 4C are a plane layout diagram and cross-sectional views illustrating a process of forming the deep trench DT according to one or more embodiments. In detail, FIG. 4B is a cross-sectional view taken along line X1-X1' of FIG. 4A, and FIG. 4C is a cross-sectional view taken along line Y1-Y1' of FIG. 4A.

Referring to FIGS. 4A to 4C, the preliminary isolation layer 112ap and the semiconductor layer 110 are partially etched to form the deep trench DT defining the plurality of element regions RX1 and RX2. The plurality of element regions RX1 and RX2 may include the first element region RX1 and the second element region RX2.

The deep trench DT may be formed to have the first width W1 in the first horizontal direction (X direction) between the first element region RX1 and the second element region RX2. The deep trench DT may extend from the upper surface of the preliminary isolation layer 112ap to the inside of the semiconductor layer 110. A bottom surface of the deep trench DT may be at a level lower than that of the main surface 110M of the semiconductor layer 110 and higher than that of the lower surface of the semiconductor layer 110.

In the specification, the descriptions are provided based on the first element region RX1 for convenience of description, but the descriptions about the first element region RX1 may be also applied to the second element region RX2. Elements that are the same as or similar to those connected to the first element region RX1 may be also connected to the second element region RX2.

Figure 5A:
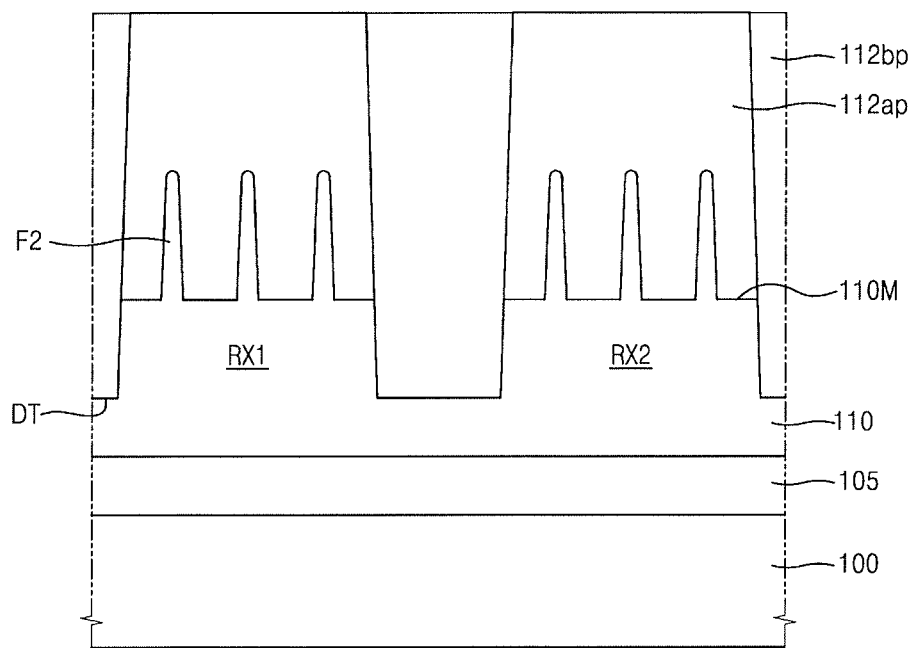
Figure 5A:
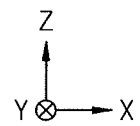
Figure 5B:
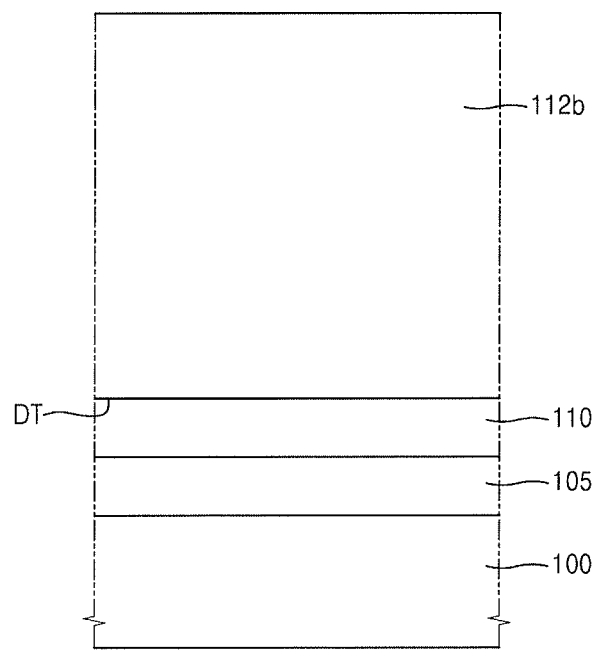
Figure 5B:
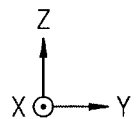

FIGS. 5A and 5B are cross-sectional views illustrating a process of forming a preliminary separation insulation layer 112bp according to one or more embodiments. In detail, FIG. 5A is a cross-sectional view taken along a portion corresponding to X1-X1' in FIG. 4A, and FIG. 5B is a cross-sectional view taken along a portion corresponding to Y1-Y1' in FIG. 4A.

Referring to FIGS. 5A and 5B, the preliminary separation insulation layer 112bp is formed to fill the deep trench DT. The preliminary separation insulation layer 112bp may include, e.g., a silicon oxide layer, but is not limited thereto. An upper surface of the preliminary separation insulation layer 112bp and an upper surface of the preliminary isolation layer 112ap may be at the same level, but are not limited thereto. For example, the upper surface of the preliminary separation insulation layer 112bp may be formed at a higher level than that of the upper surface of the preliminary isolation layer 112ap, and thus, the upper surface of the preliminary isolation layer 112ap may be covered.

Figure 6A:
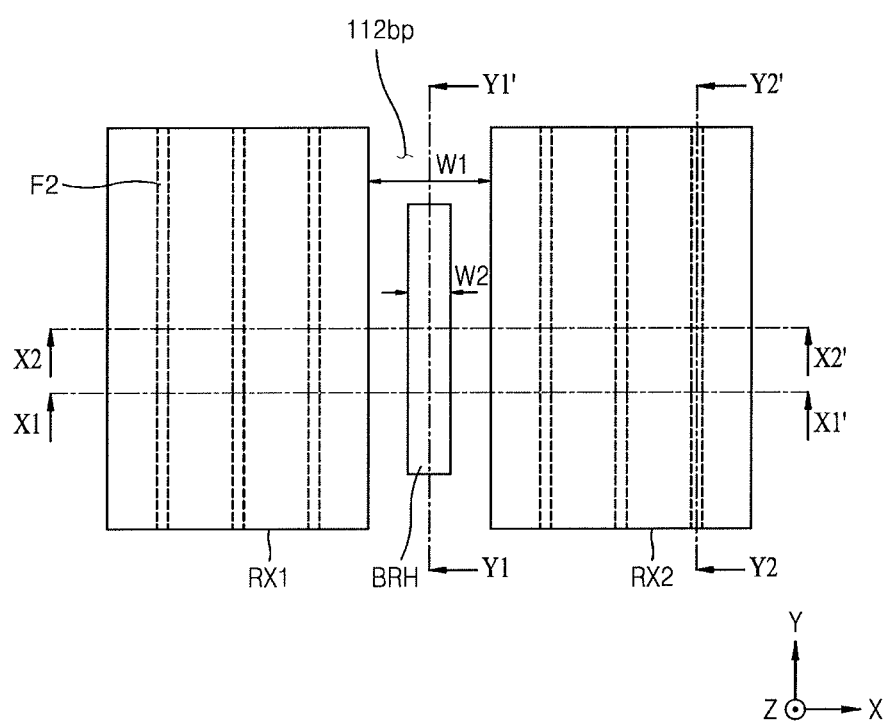
Figure 6B:
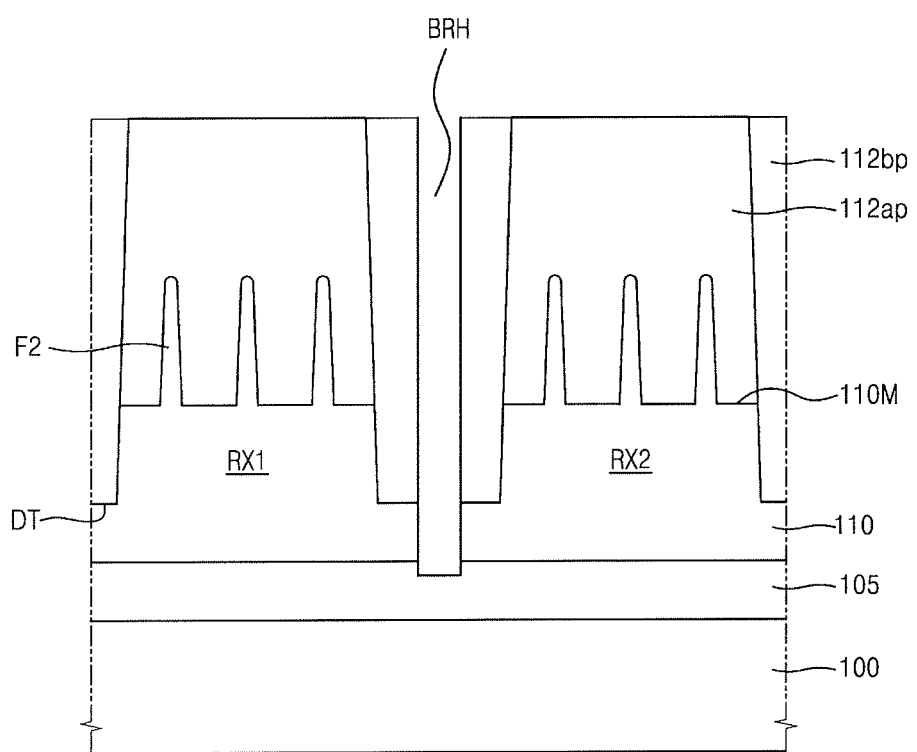
Figure 6B:
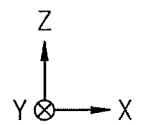
Figure 6C:
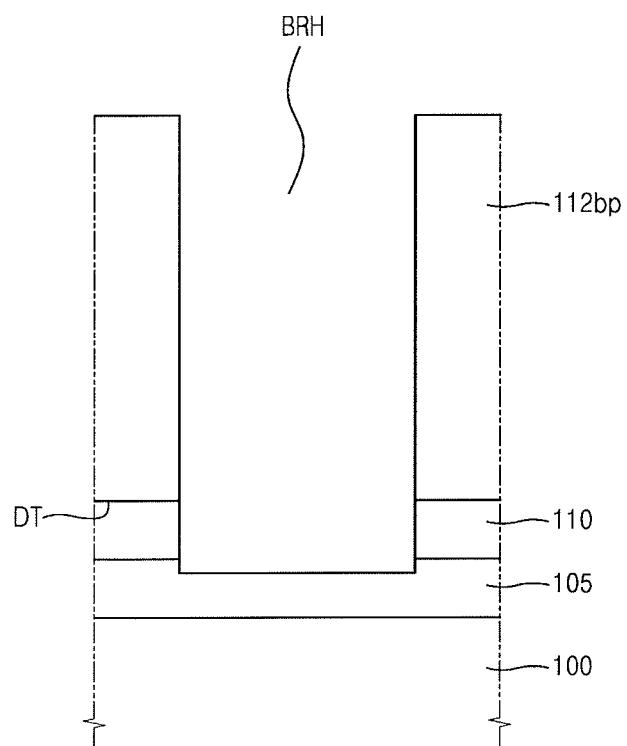
Figure 6D:
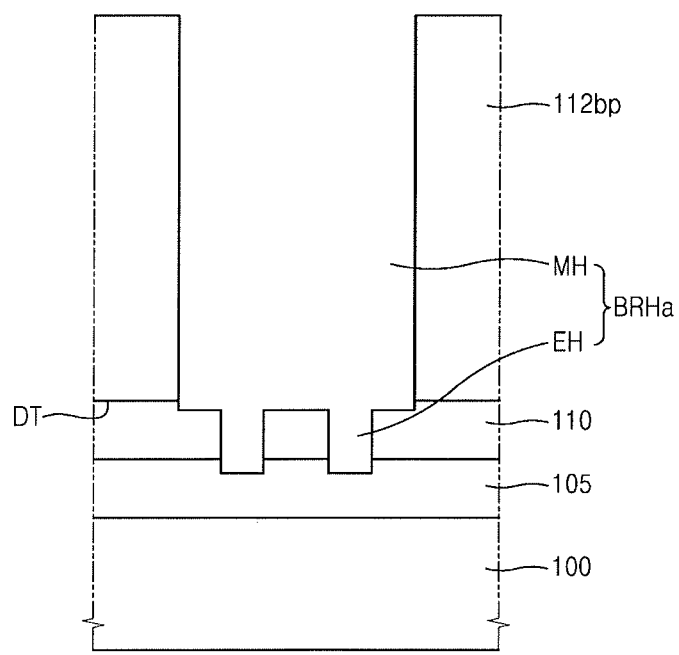
Figure 6D:

FIGS. 6A to 6C are a plane layout diagram and cross-sectional views showing a process of forming the buried rail hole BRH according to one or more embodiments, and FIG. 6D is a cross-sectional view illustrating a process of forming a buried rail hole BRHa according to one or more embodiments. In detail, FIG. 6B is a cross-sectional view taken along line X1-X1' of FIG. 6A, and FIGS. 6C and 6D are cross-sectional views taken along line Y1-Y1' of FIG. 6A.

Referring to FIGS. 6A to 6C, the buried rail hole BRH may extend to the embedded insulation layer 105 after penetrating through the preliminary separation insulation layer 112bp and the semiconductor layer 110. The embedded insulation layer 105 may be exposed from a bottom surface of the buried rail hole BRH. The buried rail hole BRH extends to the embedded insulation layer 105 after penetrating through the preliminary separation insulation layer 112bp and the semiconductor layer 110, but may not extend to the lower surface of the embedded insulation layer 105, i.e., the base substrate layer 100. A bottom surface of the buried rail hole BRH is at the same level as or lower than that of the lower surface of the semiconductor layer 110, but may be at a higher level than the lower surface of the embedded insulation layer 105, i.e., the upper surface of the base substrate layer 100.

The buried rail hole BRH may have the second width W2 in the first horizontal direction (X direction) between the first element region RX1 and the second element region RX2, and may extend in the second horizontal direction (Y direction). An extending length of the buried rail hole BRH in the second horizontal direction (Y direction) may be greater than the second width W2 thereof, as illustrated in FIG. 1A. The second width W2 may be less than the first width W1. That is, in the first horizontal direction (X direction), the second width W2 of the buried rail hole BRH may be less than the first width W1 of the deep trench DT.

Referring to FIG. 6D, the buried rail hole BRHa may extend to the embedded insulation layer 106 after penetrating through the preliminary separation insulation layer 112bp and the semiconductor layer 110. The buried rail hole BRHa of FIG. 6D may include a main hole MH and an extending hole EH connected to the main hole MH.

That is, the buried rail hole BRH shown in FIGS. 6A to 6C has a constant extending length in the second horizontal direction (Y direction) and extends from the upper surface of the preliminary separation insulation layer 112bp to the embedded insulation layer 105. However, the buried rail hole BRHa of FIG. 6D has a constant extending length in the second horizontal direction (Y direction) and may include the main hole MH extending from the upper surface of the preliminary separation insulation layer 112bp towards the embedded insulation layer 105 and the extending hole EH connecting to the main hole MH and extending from a bottom surface of the main hole MH to the embedded insulation layer 105. In some embodiments, in the buried rail hole BRHa of FIG. 6D, the main hole MH may extend from the upper surface of the preliminary separation insulation layer 112bp to the semiconductor layer 110. For example, the bottom surface of the main hole MH in the buried rail hole BRHa is at a level that is the same as or lower than that of the upper surface of the semiconductor layer 110, but may be at a higher level than the lower surface of the semiconductor layer 110, i.e., the upper surface of the embedded insulation layer 105. For example, a bottom surface of the extending hole EH in the buried rail hole BRHa is at a level that is the same as or lower than that of the lower surface of the semiconductor layer 110, but may be at a higher level than the lower surface of the embedded insulation layer 105, i.e., the upper surface of the base substrate layer 100.

In FIG. 6D, two extending holes EH are connected to the main hole MH, but one or more embodiments are not limited thereto. For example, the buried rail hole BRHa may include one extending hole EH connected to the main hole MH or three or more extending holes EH connected to the main hole MH.

The buried rail hole BRH shown in FIGS. 6A to 6C may be formed through one etching process by using one mask. The buried rail hole BRHa of FIG. 6D may be formed through two etching processes by using two masks. Here, one etching process or one of the two etching processes may not only denote an etching process under the same etching atmosphere, but also may include successive etching processes performed while changing the etching atmosphere.

Figure 7:
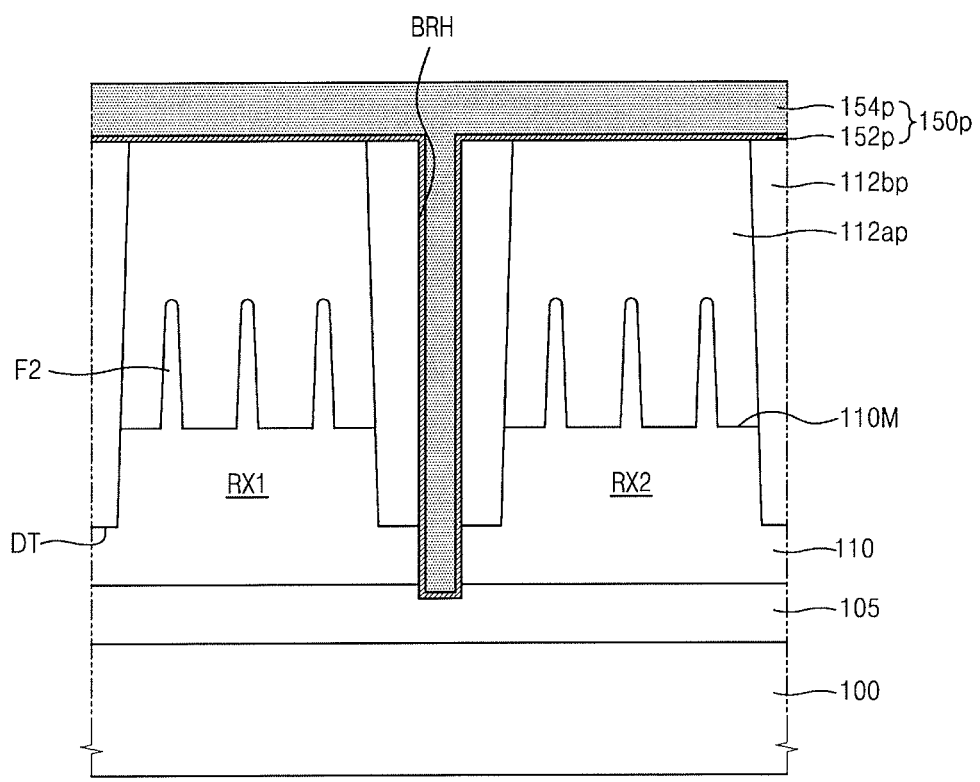
Figure 7:
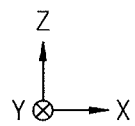

FIG. 7 is a cross-sectional view showing a process of forming a preliminary buried rail 150p according to one or more embodiments. In detail, FIG. 7 is a cross-sectional view of a portion taken along line X1-X1' in FIG. 6A.

Referring to FIG. 7, the preliminary buried rail 150p is filled in the buried rail hole BRH. The preliminary buried rail 150p may cover the upper surface of the preliminary isolation layer 112ap and the upper surface of the preliminary separation insulation layer 112bp. In some embodiments, a liner insulation layer that conformally covers an internal wall and the bottom surface of the buried rail hole BRH may be formed before forming the preliminary buried rail 150p. The liner insulation layer may include, e.g., at least one of $SiO_x$, SiN, and SiOCN.

The preliminary buried rail 150p may include a preliminary buried barrier layer 152p and a preliminary buried conductive layer 154p. The preliminary buried barrier layer 152p may be formed to conformally cover the internal wall and the bottom surface of the buried rail hole BRH, the upper surface of the preliminary isolation layer 112ap, and the upper surface of the preliminary separation insulation layer 112bp. The preliminary buried conductive layer 154p may cover a surface of the preliminary buried barrier layer 152p and may be filled in the buried rail hole BRH.

The preliminary buried barrier layer 152p may include, e.g., Ti, Ta, TiN, TaN, or a combination thereof. The preliminary buried conductive layer 154p may include, e.g., W, Mo, Ru, Nb, Hf, or a combination thereof.

Figure 8A:
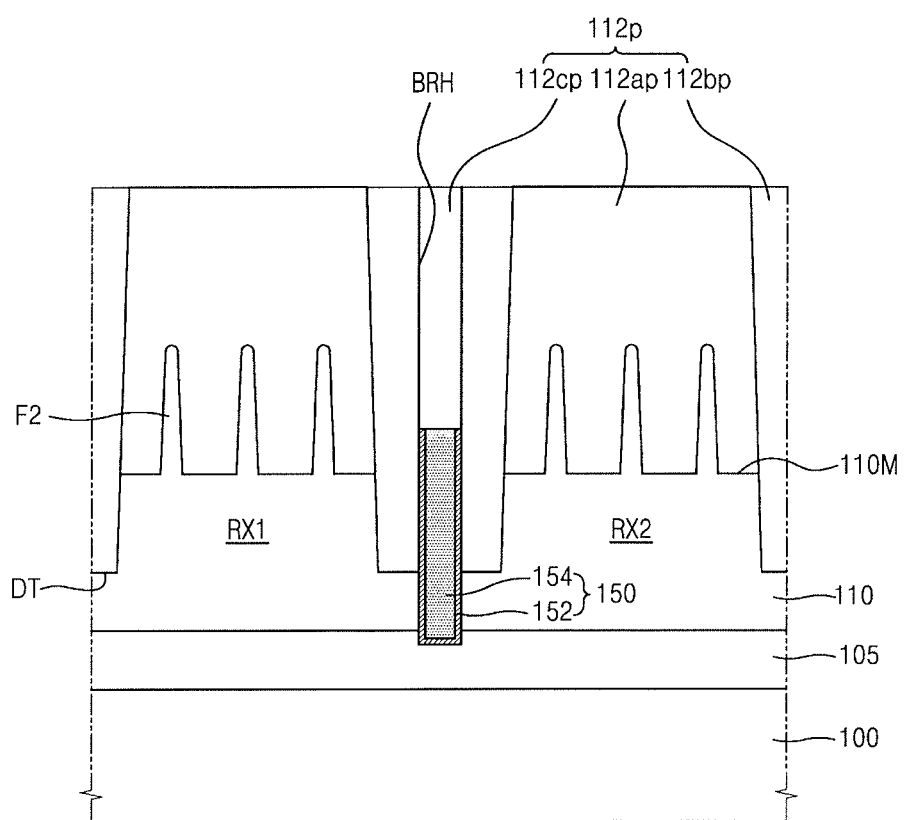
Figure 8B:
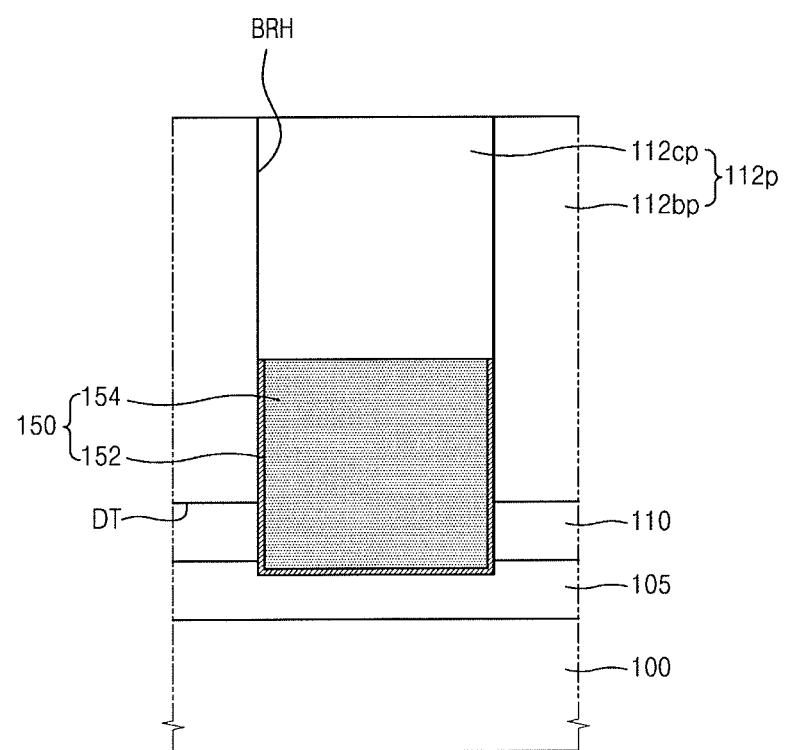
Figure 8C:
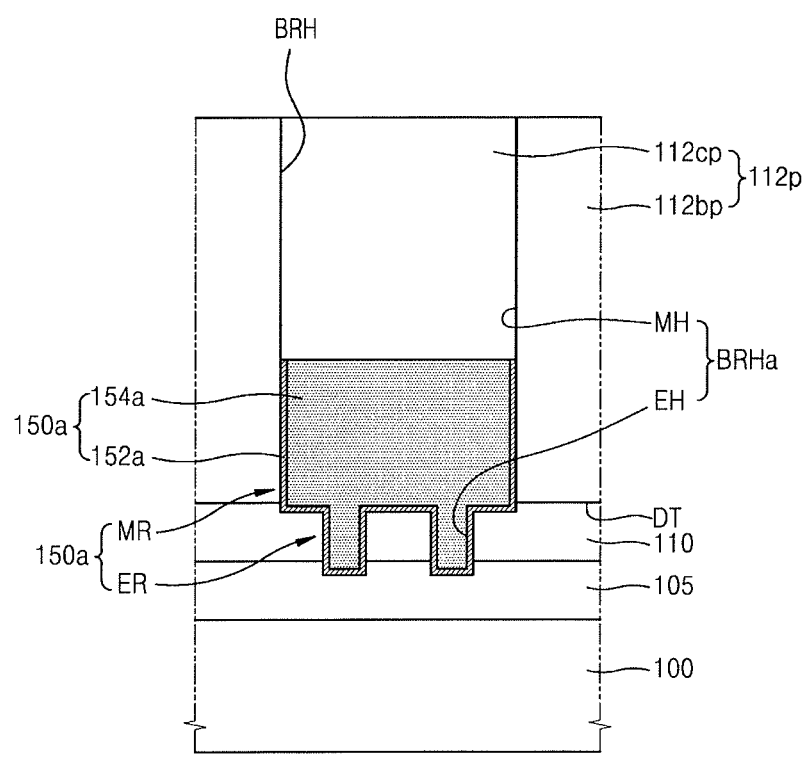

FIGS. 8A and 8B are cross-sectional views illustrating a process of forming the buried rail 150 according to one or more embodiments, and FIG. 8C is a cross-sectional view illustrating a buried rail 150a according to one or more embodiments. In detail, FIG. 8A is a cross-sectional view of a portion taken along line X1-X1' in FIG. 6A, and FIGS. 8B and 8C are cross-sectional views taken along line Y1-Y1' in FIG. 6A.

Referring to FIGS. 8A and 8B, the preliminary buried rail (150p of FIG. 7) is partially removed to form the buried rail 150. The buried rail 150 may be formed by partially removing the preliminary buried rail 150p, i.e., a portion covering the upper surface of the preliminary isolation layer 112ap and the upper surface of the preliminary separation insulation layer 112bp and a portion filled in an upper part of the buried rail hole BRH.

The buried rail 150 may include the buried barrier layer 152 and the buried conductive layer 154. The buried barrier layer 152 may conformally cover an internal wall and a bottom surface of a lower portion of the buried rail hole BRH, and the buried conductive layer 154 may fill in the lower portion of the buried rail hole BRH while covering the buried barrier layer 152.

The upper surface of the buried rail 150 may be at a lower level than the upper ends of the plurality of preliminary fin-type active areas F2 and higher level than the main surface 110M of the semiconductor layer 110. The buried rail 150 may have a plate-shaped structure on a Y-Z plane.

After forming the buried rail 150, a preliminary cover insulation layer 112cp is formed to fill a remaining portion of the buried rail hole BRH, i.e., an upper side portion of the buried rail hole BRH. The preliminary cover insulation layer 112cp may include, e.g., a silicon oxide layer, but is not limited thereto. An upper surface of the preliminary cover insulation layer 112cp may be at the same level as the upper surface of the preliminary isolation layer 112ap and/or the upper surface of the preliminary separation insulation layer 112bp, but is not limited thereto. For example, the upper surface of the preliminary cover insulation layer 112cp may be at a higher level than the upper surface of the preliminary isolation layer 112ap and the upper surface of the preliminary separation insulation layer 112bp, and thus, the preliminary cover insulation layer 112cp covers the upper surface of the preliminary isolation layer 112ap and the upper surface of the preliminary separation insulation layer 112bp. The preliminary isolation layer 112ap, the preliminary separation insulation layer 112bp, and the preliminary cover insulation layer 112cp may be collectively referred as a preliminary separation insulation structure 112p.

Referring to FIG. 8C, the preliminary buried rail (150p of FIG. 7) is partially removed to form the buried rail 150a. The buried rail 150a may be formed by partially removing the preliminary buried rail 150p, i.e., a portion covering the upper surface of the preliminary isolation layer 112ap and the upper surface of the preliminary separation insulation layer 112bp and a portion filled in an upper part of the buried rail hole BRHa of FIG. 6D.

The buried rail 150a may include a buried barrier layer 152a and a buried conductive layer 154a. The buried barrier layer 152a may conformally cover an internal wall and a bottom surface of a lower portion of the buried rail hole BRHa, and the buried conductive layer 154a may fill in the lower portion of the buried rail hole BRHa while covering the buried barrier layer 152a.

The upper surface of the buried rail 150a may be at a lower level than the upper ends of the plurality of preliminary fin-type active areas F2 and higher level than the main surface 110M of the semiconductor layer 110.

The buried rail 150a may include a main rail portion MR filled in a lower portion of the main hole MH and an extending rail portion ER filled in the extending hole EH and extending from a lower surface of the main rail portion MR. The main rail portion MR may have a plate-shaped structure on a Y-Z plane and the extending rail portion ER may have a via structure connected to the lower surface of the main rail portion MR.

In some embodiments, the lower surface of the main rail portion MR may be at the same level as or lower level than the upper surface of the semiconductor layer 110, but may be at a higher level than the lower surface of the semiconductor layer 110, that is, the upper surface of the embedded insulation layer 105. For example, the lower surface of the extending hole EH is at the same level as or lower than that of the lower surface of the semiconductor layer 110, but may be at a higher level than the lower surface of the embedded insulation layer 105, that is, the upper surface of the base substrate layer 100.

In FIG. 6D, two extending holes EH are connected to the main hole MR, but one or more embodiments are not limited thereto. For example, the buried rail hole BRHa may include one extending hole EH connected to the main hole MH or three or more extending holes EH connected to the main hole MH.

In FIG. 8C, two extending rail portions ER are connected to the main rail portion MR, but one or more embodiments are not limited thereto. For example, the buried rail 150a may include the main rail portion MR and one extending rail portion ER connected to the main rail portion MR, or the main rail portion MR and three or more extending rail portions ER connected to the main rail portion MR.

After forming the buried rail 150a, a preliminary cover insulation layer 112cp is formed to fill a remaining portion of the buried rail hole BRH, that is, an upper side portion of the buried rail hole BRH. The preliminary cover insulation layer 112cp may include, for example, a silicon oxide layer, but is not limited thereto. An upper surface of the preliminary cover insulation layer 112cp may be at the same level as the upper surface of the preliminary isolation layer 112ap and/or the upper surface of the preliminary separation insulation layer 112bp, but is not limited thereto. For example, the upper surface of the preliminary cover insulation layer 112cp may be at a higher level than the upper surface of the preliminary isolation layer 112ap and the upper surface of the preliminary separation insulation layer 112bp, and thus, the preliminary cover insulation layer 112cp covers the upper surface of the preliminary isolation layer 112ap and the upper surface of the preliminary separation insulation layer 112bp. The preliminary isolation layer 112ap, the preliminary separation insulation layer 112bp, and the preliminary cover insulation layer 112cp may be collectively referred as a preliminary separation insulation structure 112p.

Figure 9:
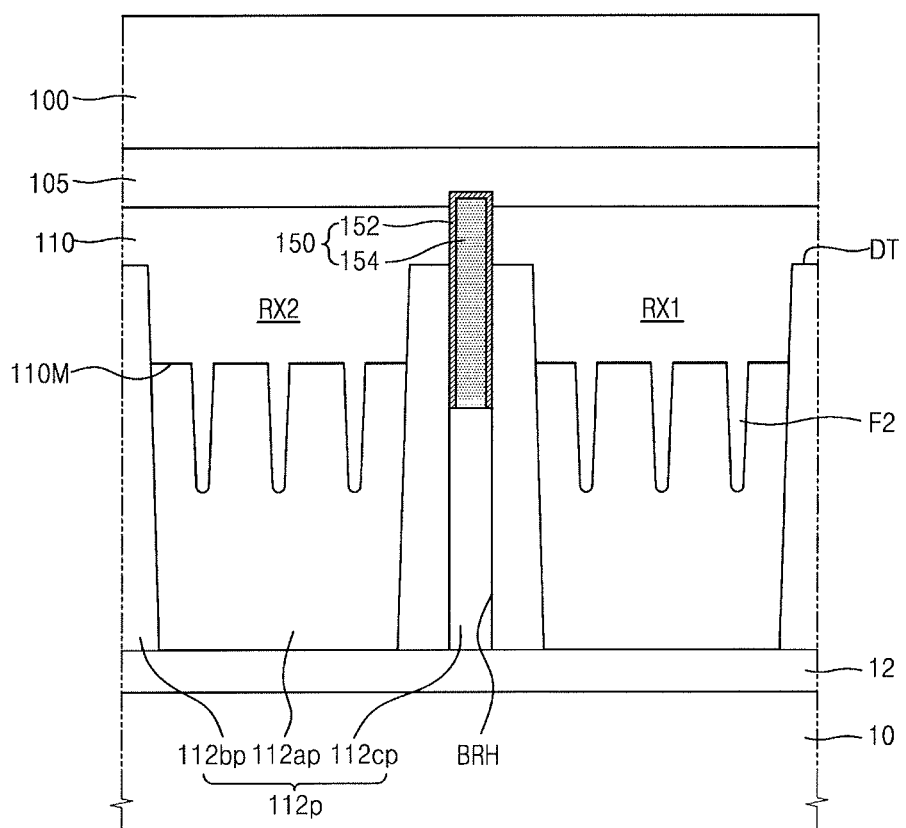

FIG. 9 is a cross-sectional view illustrating a process of attaching the structure of FIGS. 8A-8C onto the carrier substrate 10 according to one or more embodiments. In detail, FIG. 9 is a cross-sectional view taken along a portion in FIG. 6A corresponding to line X1-X1'.

Referring to FIG. 9, the structure of FIGS. 8A-8C is reversed, i.e., turned upside-down, so that the base substrate layer 100 faces upward and is attached to the carrier substrate 10 in a state in which the preliminary separation insulation structure 112p faces the carrier substrate 10. An adhesive film 12 may be arranged between the preliminary separation insulation structure 112p and the carrier substrate 10.

The carrier substrate 10 may have an area that is substantially equal to that of the base substrate layer 100 or greater. The carrier substrate 10 may include, e.g., a semiconductor wafer, a ceramic substrate, or a glass substrate. The adhesive film 12 may include a base film and adhesive layers attached to opposite surfaces of the base film. The base film may include, e.g., a polyethylene-based film such as polyethylene terephthalate (PET) or polyethylene-2,6-naphthalenedicarboxylate (PEN), or a polyolefin-based film. The base film may be obtained by coating a polyethylene-based film or a polyolefin-based film with silicone or Teflon. The adhesive layers may each include, e.g., an acrylic-based polymer resin, an epoxy resin, or a mixture thereof.

Figure 10:
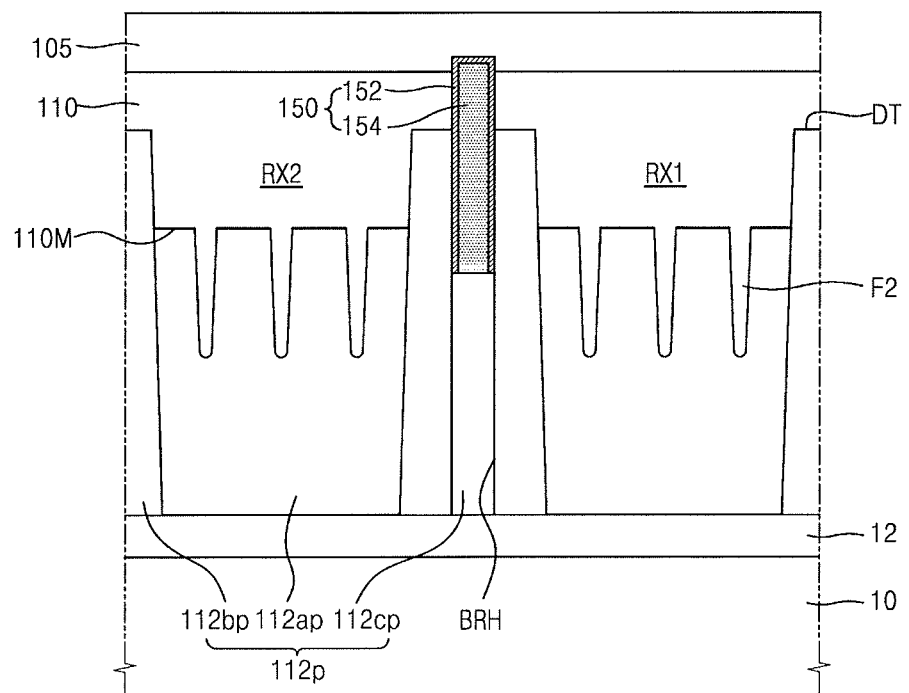

FIG. 10 is a cross-sectional view illustrating a process of removing the base substrate layer (100 of FIG. 9) according to one or more embodiments. In detail, FIG. 10 is a cross-sectional view taken along a portion in FIG. 6A corresponding to line X1-X1'.

Referring to FIG. 10, the base substrate layer 100 (see FIG. 9) is removed to expose the embedded insulation layer 105. The base substrate layer 100 may be completely removed to expose the embedded insulation layer 105. The base substrate layer 100 may be removed by a backgrinding or a back lap process. For example, in order to expose the embedded insulation layer 105, the base substrate layer 100 may be removed by a chemical mechanical polishing (CMP) process, an etch-back process, or a combination thereof.

Figure 11:
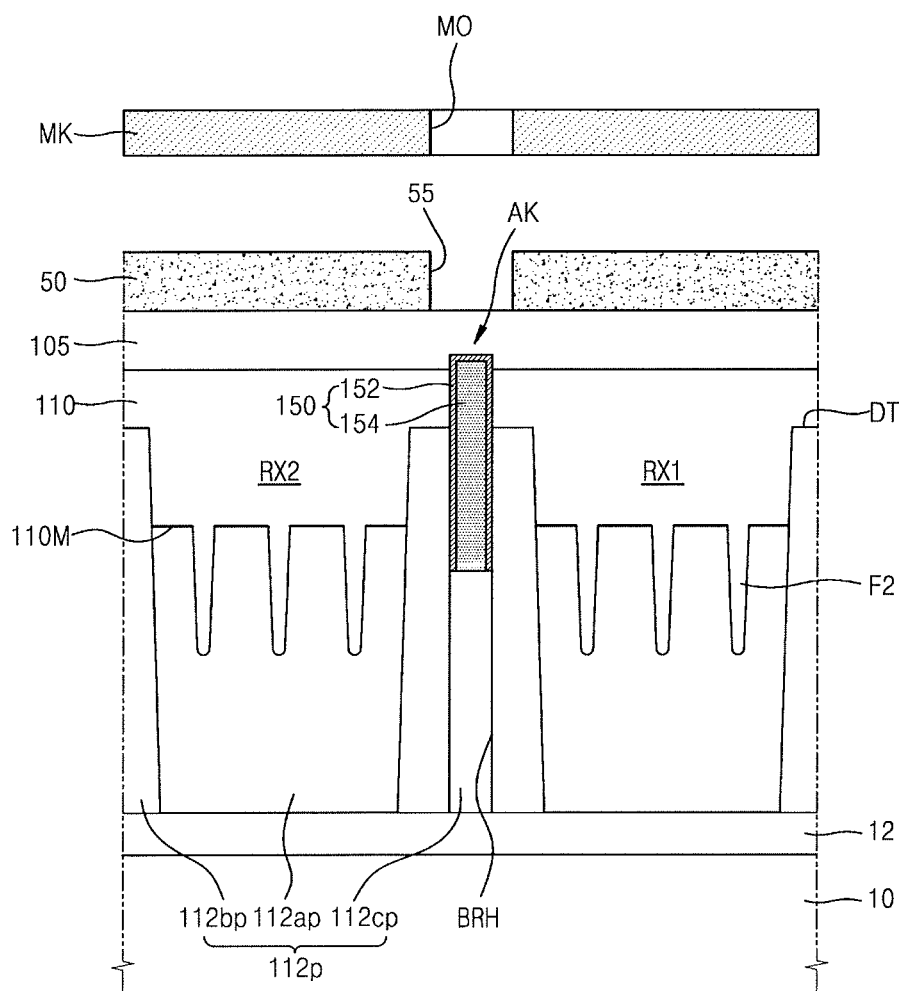

FIG. 11 is a cross-sectional view illustrating a process of a mask pattern 50 according to one or more embodiments. In detail, FIG. 11 is a cross-sectional view taken along a portion in FIG. 6A corresponding to line X1-X1'.

Referring to FIG. 11, the mask pattern 50 having an opening 55 is formed on the embedded insulation layer 105 by using a photomask MK having a light transmitting portion MO. The mask pattern 50 may be formed by forming a photoresist layer on the embedded insulation layer 105 and performing a photolithography process, in which an exposure and a development are performed by using the photomask MK having the light transmitting portion MO. FIG. 11 shows that the mask pattern 50 is formed by using a positive photoresist layer, but one or more embodiments are not limited thereto. For example, the mask pattern 50 may be formed by using a negative photoresist layer.

During the photolithography process using the photomask MK, the buried rail 150 may function as an alignment key AK. That is, the embedded insulation layer 105 has a relatively excellent light transmittance, and thus, the buried rail 150 extending to the embedded insulation layer 105 after penetrating through the semiconductor layer 110 may function as the alignment key AK. Therefore, even when an additional alignment key is not formed in the semiconductor layer 110 and/or the embedded insulation layer 105, the mask pattern 50 may be formed so that the opening 55 of the mask pattern 50 may be aligned in a direction perpendicular to the buried rail 150 (Z direction).

Figure 12:
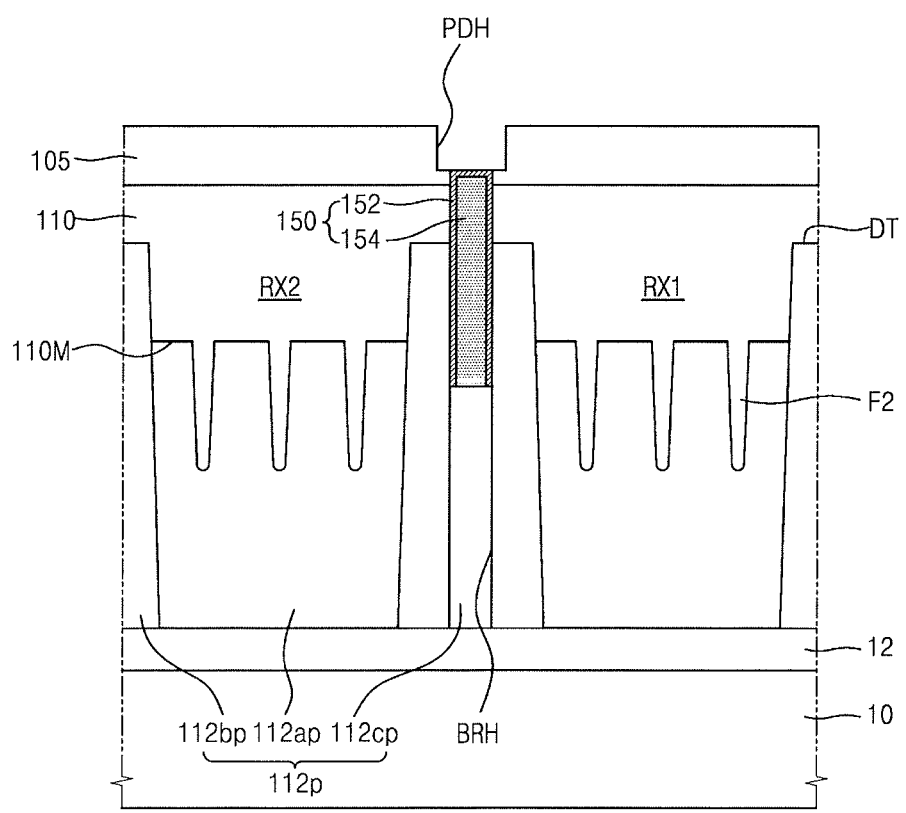
Figure 12:
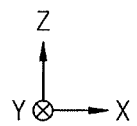

FIG. 12 is a cross-sectional view illustrating a process of forming the power delivery hole PDH according to one or more embodiments. In detail, FIG. 12 is a cross-sectional view taken along a portion in FIG. 6A corresponding to line X1-X1'.

Referring to FIGS. 11 and 12, an etching process for partially removing the embedded insulation layer 105 by using the mask pattern 50 as an etching mask, and then the power delivery hole PDH, in which the buried rail 150 is exposed, is formed. The power delivery hole PDH may be formed by removing a portion of the embedded insulation layer 105, which is at a bottom surface of the opening 55 in the mask pattern 50.

In FIG. 12, the buried rail 150 is exposed on the bottom surface of the power delivery hole PDH, but the semiconductor layer 110 is not exposed and the embedded insulation layer 105 partially remains. However, one or more embodiments are not limited thereto. In some embodiments, the semiconductor layer 110 may be exposed on the bottom surface of the power delivery hole PDH.

Figure 13:
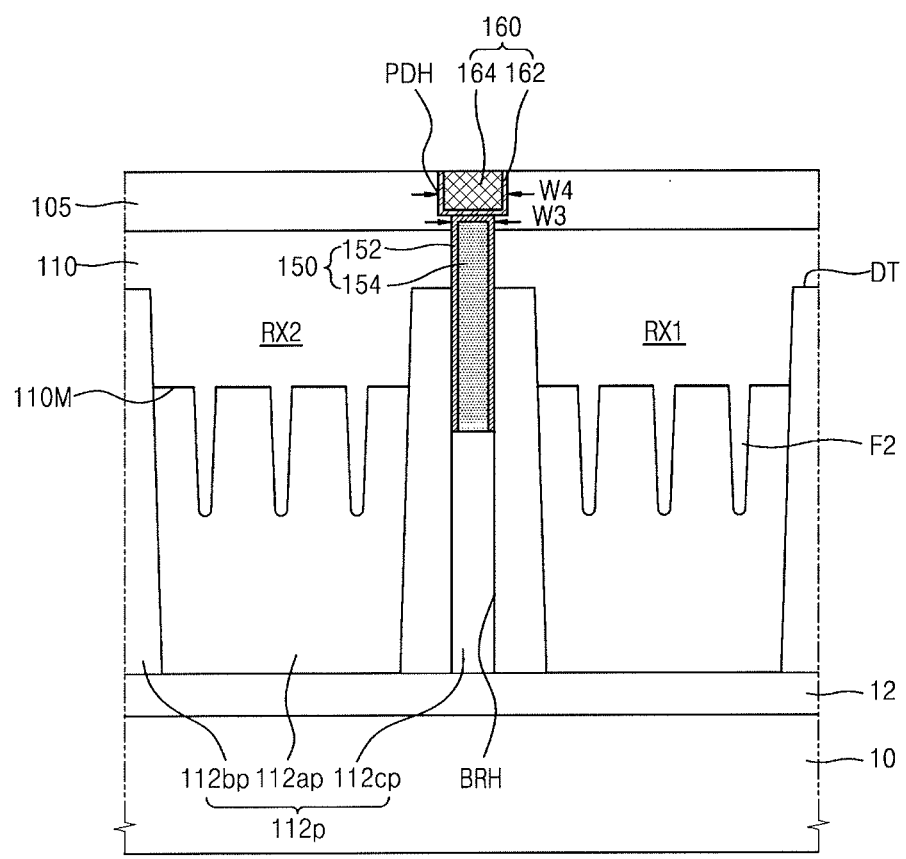
Figure 13:
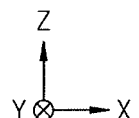

FIG. 13 is a cross-sectional view illustrating a process of forming the power delivery structure 160 according to one or more embodiments. In detail, FIG. 13 is a cross-sectional view taken along a portion in FIG. 6A corresponding to line X1-X1'.

Referring to FIG. 13, the power delivery structure 160 that fills in the power delivery hole PDH and is electrically connected to the buried rail 150 is formed. The power delivery structure 160 may include the power delivery barrier layer 162 and the power delivery conductive layer 164. The power delivery barrier layer 162 may conformally cover an internal wall and a bottom surface of the power delivery hole PDH, and the power delivery conductive layer 164 may cover the power delivery barrier layer 162 and fill in the power delivery hole PDH.

The power delivery structure 160 may be formed by forming a preliminary barrier layer covering the internal wall and the bottom surface of the power delivery hole PDH and the embedded insulation layer 105, and a preliminary conductive layer filling in the power delivery hole PDH and covering the preliminary barrier layer, and then, removing some portions of the preliminary barrier layer and the preliminary conductive layer, which cover the embedded insulation layer 105. The preliminary barrier layer may include, e.g., TiN, TaN, TaC, WCN, or a combination thereof. The preliminary conductive layer may include, e.g., Cu, Co, Ru, Mo, or a combination thereof.

In some embodiments, at a portion where the buried rail 150 and the power delivery structure 160 are in contact with each other, the third width W3 of the buried rail 150 in the first horizontal direction (X direction) may be less than the fourth width W4 of the power delivery structure 160. Therefore, even when there is an error in aligning the buried rail 150 and the power delivery hole PDH while the power delivery hole PDH for forming the power delivery structure 160 is formed, the buried rail 150 may be in contact with the power delivery structure 160 to have an excellent reliability in electrical connection therebetween. For example, the third width W3 of the buried rail 150 may equal the second width W2 of the buried rail hole BRH.

Figure 14:
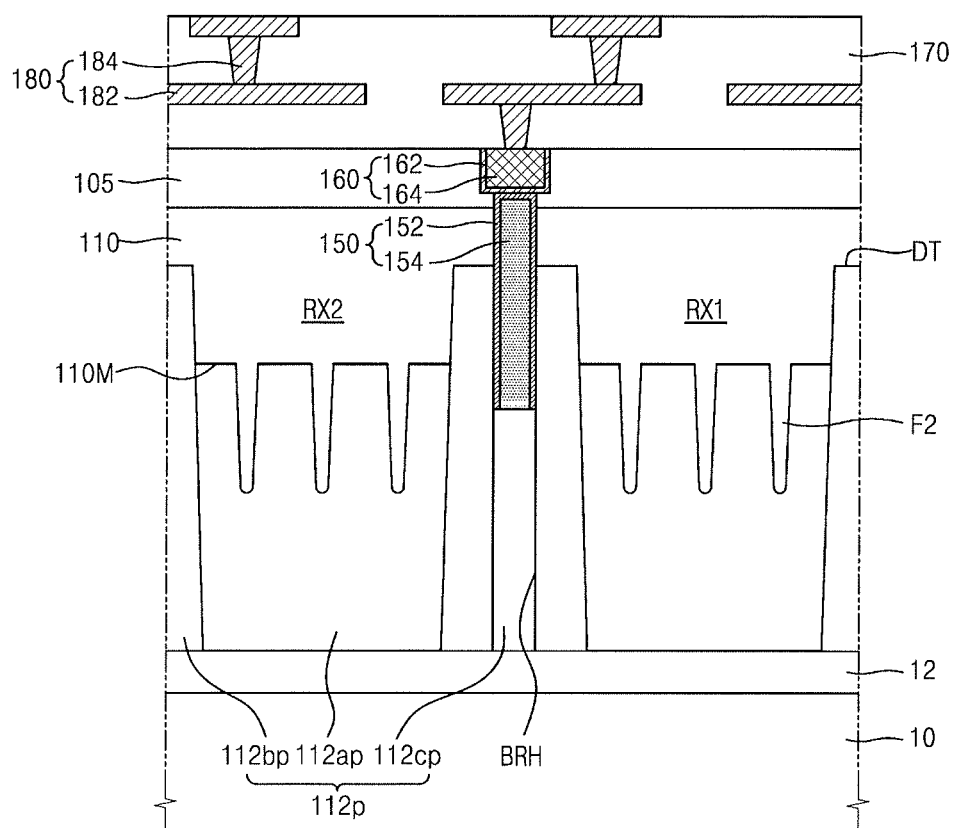
Figure 14:
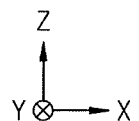

FIG. 14 is a cross-sectional view illustrating a process of forming the rear wiring structure 180 according to one or more embodiments. In detail, FIG. 14 is a cross-sectional view taken along a portion in FIG. 6A corresponding to line X1-X1'.

Referring to FIG. 14, the rear wiring structure 180 electrically connected to the power delivery structure 160 is formed on the embedded insulation layer 105. The rear wiring structure 180 may include the rear wiring layer 182 and the rear via plug 184. The rear inter-wire insulation layer 170 may partially surround the rear wiring layer 182 and the rear via plug 184 forming the rear wiring structure 180 on the embedded insulation layer 105.

The rear wiring layer 182 and the rear via plug 184 may each include a barrier layer for rear wiring and a metal layer for rear wiring. The barrier layer for rear wiring may include at least one of, e.g., Ti, TiN, Ta, and TaN. The metal layer for rear wiring may include, e.g., at least one metal of W, Al, and Cu. The rear inter-wire insulation layer 170 may include, e.g., silicon oxide and/or a low-k dielectric layer having a dielectric constant lower than that of the silicon oxide. In some embodiments, the rear inter-wire insulation layer 170 may further include a passivation layer on a surface away from the embedded insulation layer 105, i.e., an upper surface of the rear inter-wire insulation layer 170 in FIG. 14. In some embodiments, the passivation layer may include silicon nitride.

Figure 15:
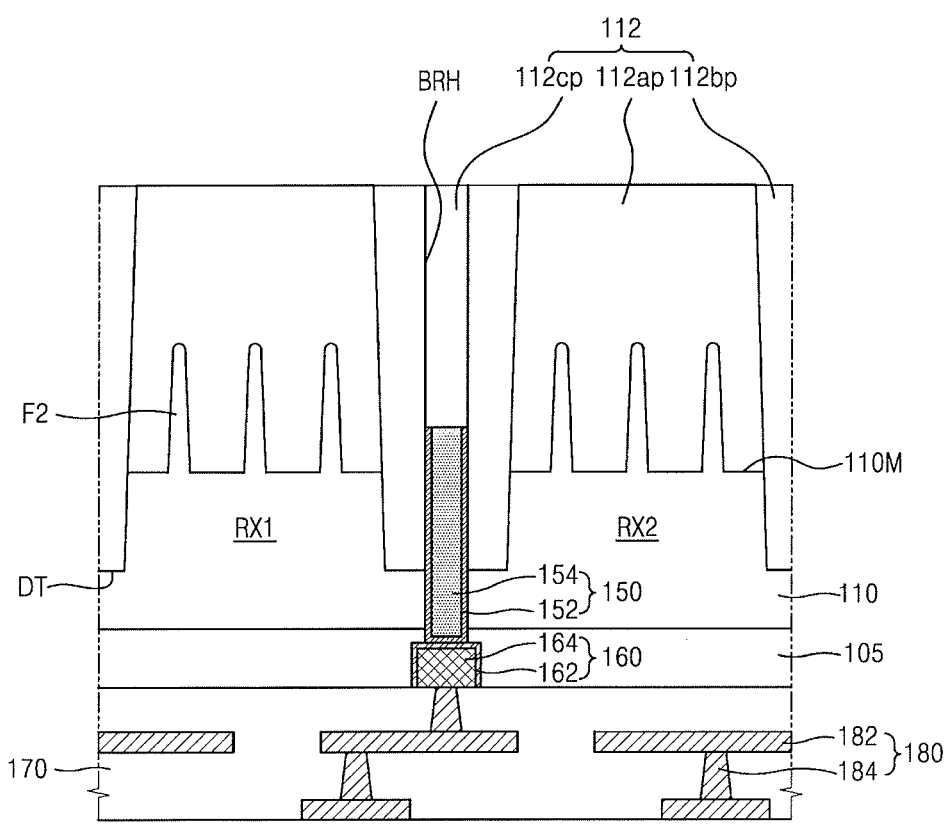

FIG. 15 is a cross-sectional view illustrating a process of removing the carrier substrate 10 from the structure of FIG. 14, according to one or more embodiments. In detail, FIG. 15 is a cross-sectional view taken along a portion in FIG. 6A corresponding to line X1-X1'.

Referring to FIG. 15, after removing the carrier substrate 10 and the adhesive film 12 from the structure of FIG. 14, the structure of FIG. 14 is reversed to make the preliminary separation insulation structure 112p face upward. Although not shown in FIG. 15, the structure of FIG. 14 may be reversed and attached to a carrier substrate, to which an adhesive film similar to that shown in FIG. 9 is attached.

Figure 16:
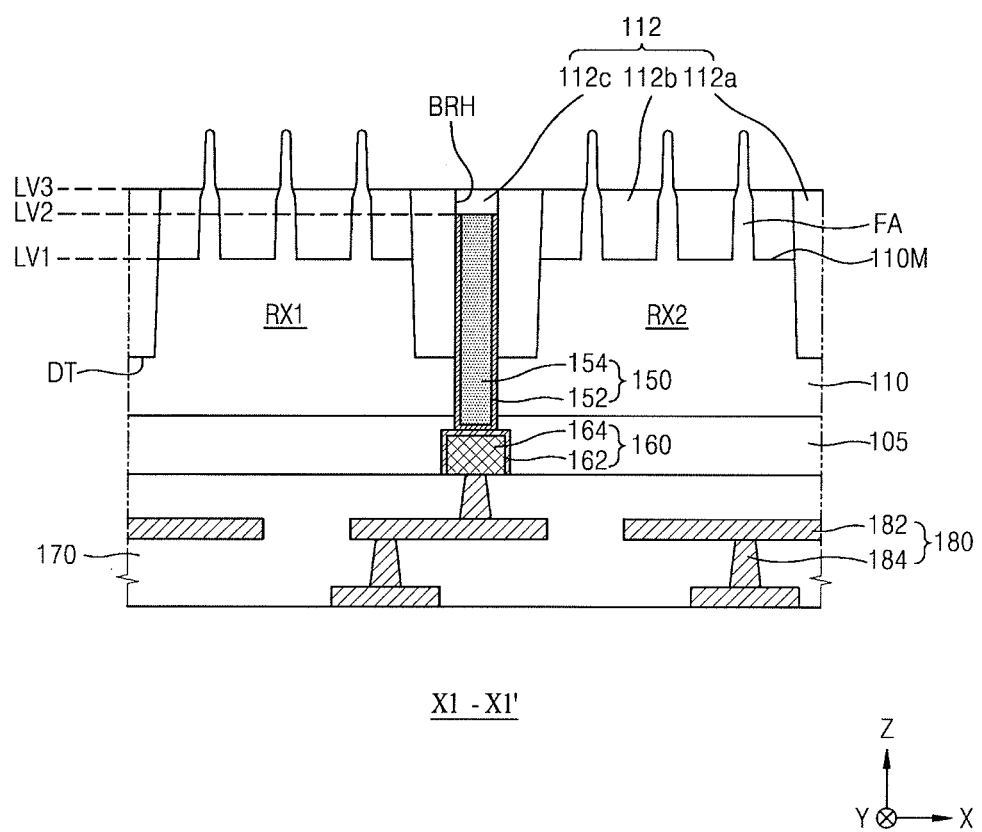

FIG. 16 is a cross-sectional view illustrating a process of forming the plurality of fin-type active areas FA according to one or more embodiments. In detail, FIG. 16 is a cross-sectional view taken along a portion in FIG. 6A corresponding to line X1-X1'.

Referring to FIGS. 15 and 16, an upper portion of the preliminary separation insulation structure 112p is partially removed to form the separation insulation structure 112. When the separation insulation structure 112 is formed by partially removing the upper portion of the preliminary separation insulation structure 112p, upper end portions of the plurality of preliminary fin-type active areas F2 exposed above the upper surface of the separation insulation structure 112 are partially removed, and then, the plurality of fin-type active areas FA may be formed and the upper end portion of each fin-type active area FA has a reduced width in the first horizontal direction (X direction) to be less than that of a lower end portion thereof. That is, each of the plurality of fin-type active areas FA may have a width of the upper end portion less than that of the lower end portion in the first horizontal direction (X direction). The separation insulation structure 112 may cover opposite side walls of the lower end portions in the plurality of fin-type active areas FA. In the plurality of element regions RX1 and RX2, the plurality of fin-type active areas FA may protrude above the upper surface of the separation insulation structure 112.

The separation insulation structure 112 may be obtained by partially removing the preliminary separation insulation structure 112p, that is, by removing a portion at a higher level than the upper surface of the buried rail 150. Therefore, the upper surface of the separation insulation structure 112 may be at a higher level than the upper surface of the buried rail 150. The separation insulation structure 112 may include an isolation layer 112a that is a portion of the preliminary isolation layer 112ap, a separation insulation layer 112b that is a portion of the preliminary separation insulation layer 112bp, and a cover insulation layer 112c that is a portion of the preliminary cover insulation layer 112cp. The isolation layer 112a covers the opposite side walls of the lower end portions in the plurality of fin-type active areas FA in the separation insulation structure 112, the separation insulation layer 112b fills in the deep trench DT in the separation insulation structure 112, and the cover insulation layer 112c may cover the upper surface of the buried rail 150 in the separation insulation structure 112, e.g., may fill in the upper portion of the buried rail hole BRH. The buried rail 150 is filled in the lower portion of the buried rail hole BRH, and the remaining portion, that is, the upper portion of the buried rail hole BRH, may be filled with the cover insulation layer 112c.

When the main surface 110M of the semiconductor layer 110 is at the first vertical level LV1, the upper surface of the buried rail 150 is at the second vertical level LV2 that is higher than the first vertical level LV1, and the upper surface of the separation insulation structure 112 may be at the third vertical level LV3 that is higher than the second vertical level LV2. Therefore, the buried rail 150 may not be exposed during forming of the separation insulation structure 112 by partially removing the upper portion of the preliminary separation insulation structure 112p.

Figure 17A:
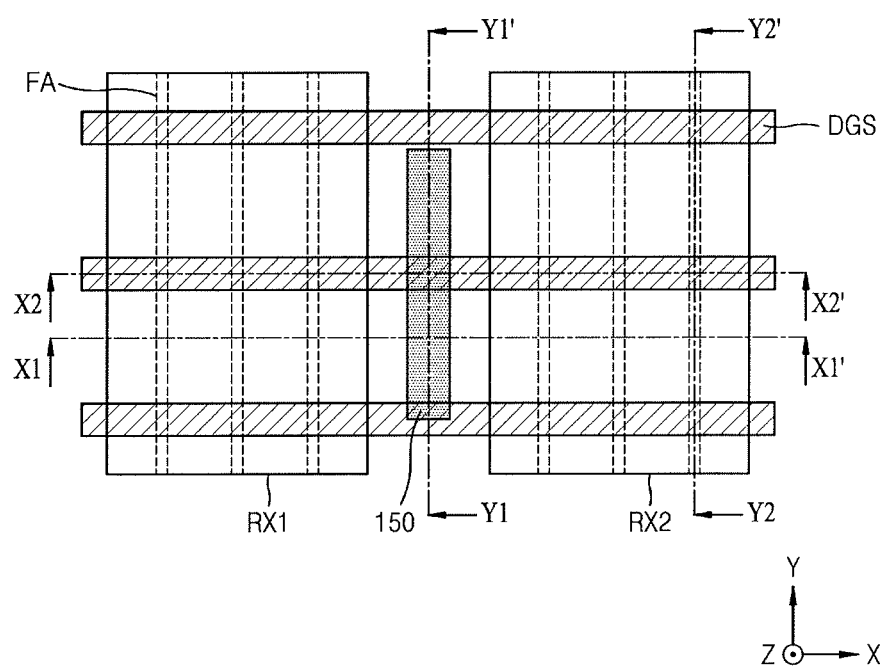
Figure 17B:
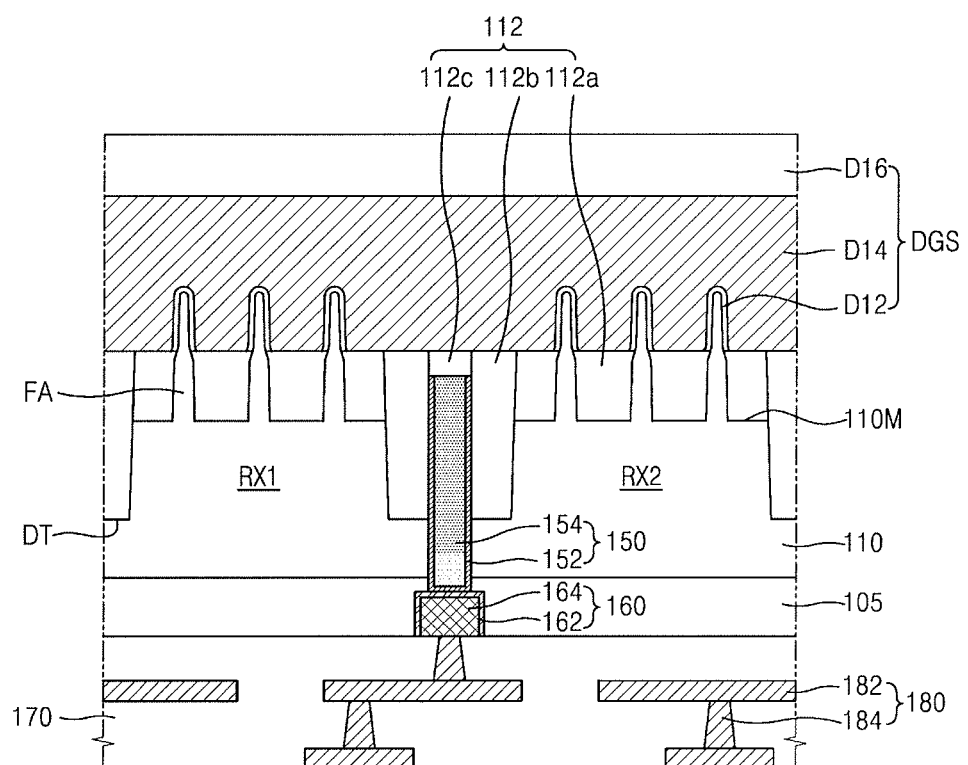
Figure 17C:
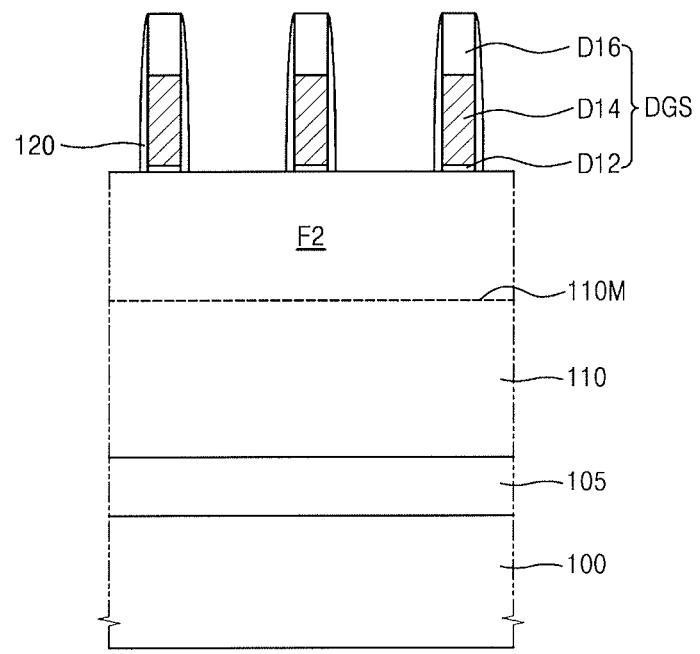
Figure 17C:
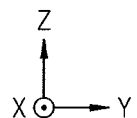

FIGS. 17A to 17C are a plane layout diagram and cross-sectional views illustrating a process of forming a dummy gate structure DGS according to one or more embodiments. In detail, FIG. 17B is a cross-sectional view taken along line X2-X2' of FIG. 17A, and FIG. 17C is a cross-sectional view taken along line Y2-Y2' of FIG. 17A.

Referring to FIGS. 17A to 17C, a plurality of dummy gate structures DGS are formed on the plurality of fin-type active areas FA to extend crossing the plurality of fin-type active areas FA. Each of the plurality of dummy gate structures DGS may include a dummy gate insulation layer D12, a dummy gate line D14, and a dummy gate insulation capping layer D16 sequentially stacked on the plurality of fin-type active areas FA. The dummy gate insulation layer D12 may include silicon oxide. The dummy gate line D14 may include polysilicon. The dummy gate insulation capping layer D16 may include silicon nitride.

Insulation spacers 120 may be formed on opposite side walls of the dummy gate structure DGS. The insulation spacer 120 may be formed by an atomic layer deposition (ALD) process or a chemical vapor deposition (CVD) process. The insulation spacer 120 may include, for example, silicon nitride.

Figure 18:
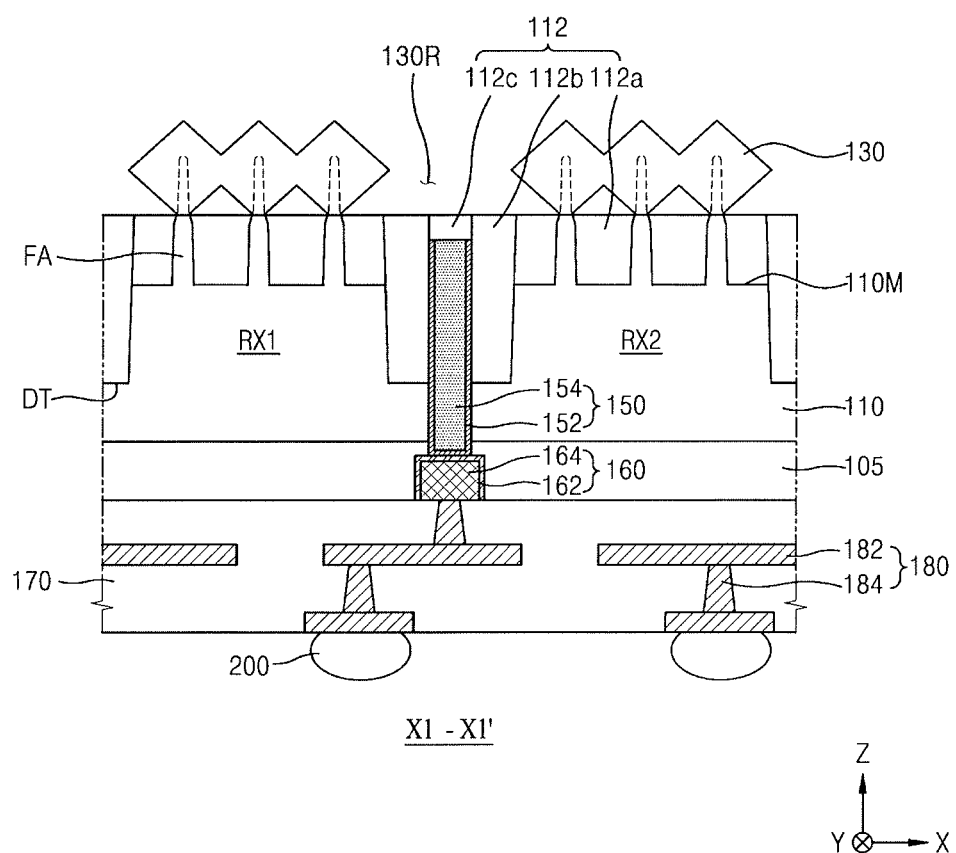

FIG. 18 is a cross-sectional view illustrating a process of forming the source/drain region 130 according to one or more embodiments. In detail, FIG. 18 is a cross-sectional view taken along a portion in FIG. 17A corresponding to the line X1-X1'.

Referring to FIGS. 17A to 18, the plurality of fin-type active areas FA are partially etched from opposite sides of the dummy gate structure DGS to form a recess 130R, and semiconductor material layers are formed through an epitaxial growth from exposed portions of the plurality of fin-type active areas FA, which are exposed through the recess 130R, to form the source/drain region 130.

The source/drain region 130 may have an embedded SiGe structure including a plurality of SiGe layers that are epitaxially grown. The plurality of SiGe layers may have different Ge content. In some embodiments, the source/drain region 130 may each include an epitaxially grown Si layer or an epitaxially grown SiC layer.

In some embodiments, the source/drain region 130 may be covered with an insulating liner. The insulating liner may conformally cover the separation insulation structure 112, the insulation spacers 120, and the source/drain region 130. The insulating liner may include a silicon nitride layer.

Figure 19A:
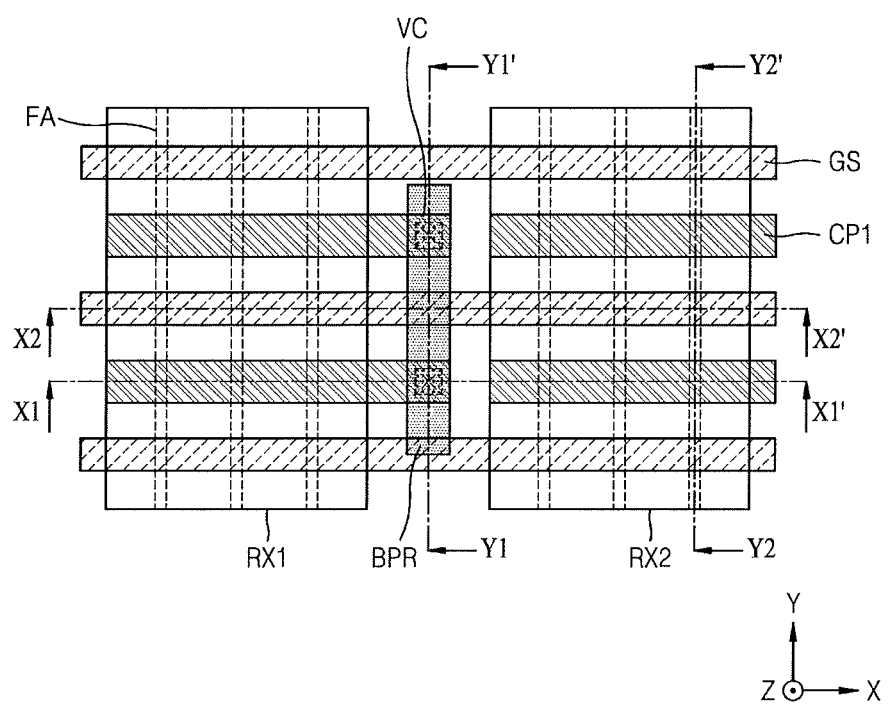
Figure 19B:
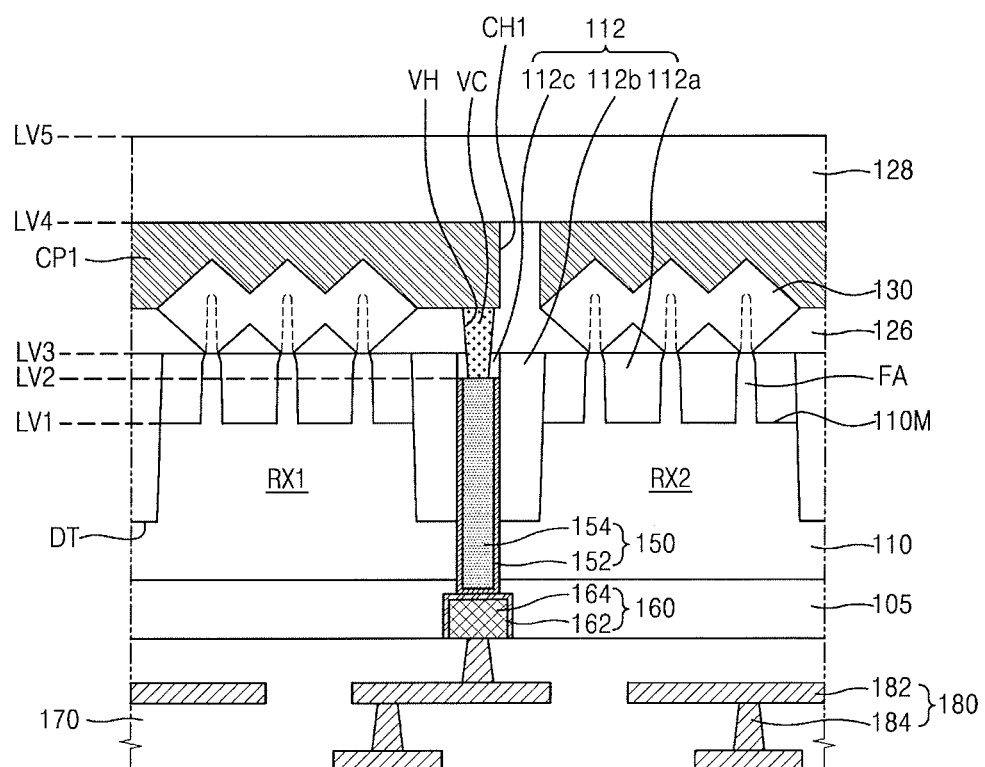
Figure 19C:
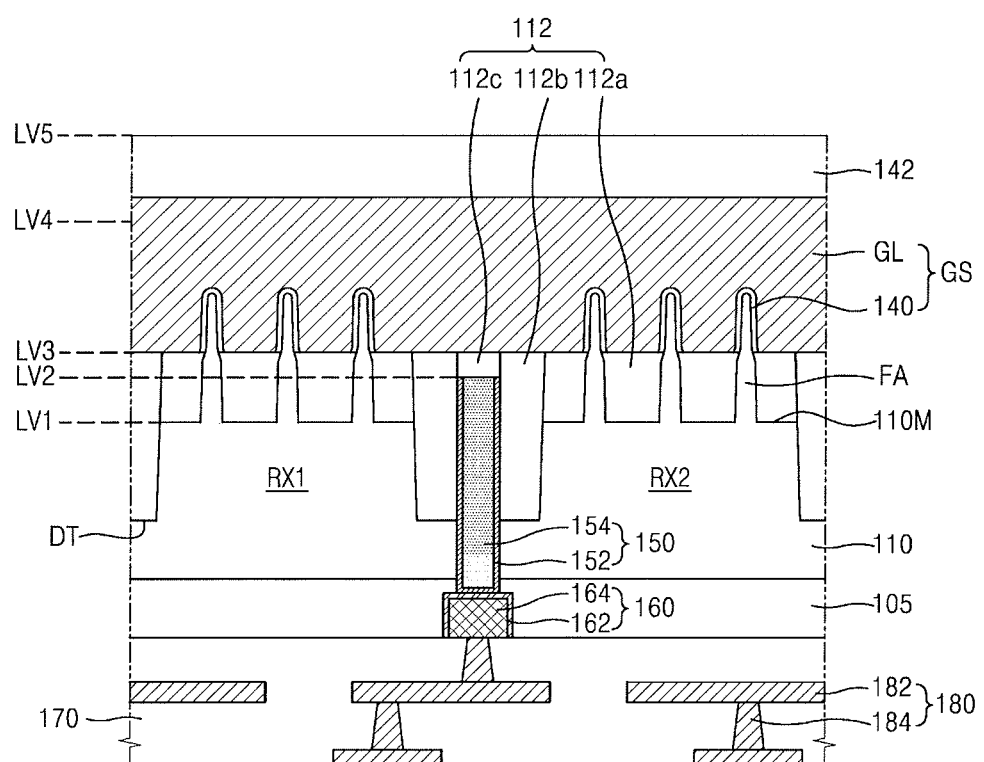
Figure 19D:
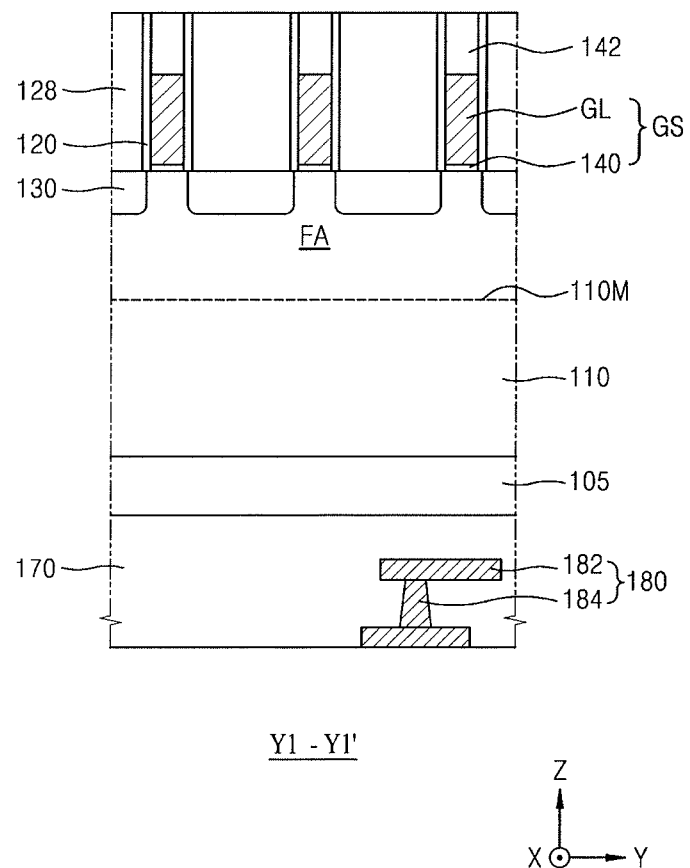

FIG. 19A is a plane layout diagram and FIGS. 19B to 19D are cross-sectional views, which illustrate a process of forming the first conductive plug CP1 and the gate structure GS according to one or more embodiments. In detail, FIG. 19B is a cross-sectional view taken along the line X1-X1' of FIG. 19A, FIG. 19C is a cross-sectional view taken along the line X2-X2' of FIG. 19A, and FIG. 19D are cross-sectional view taken along the line Y1-Y1' of FIG. 19A.

Referring to FIGS. 19A to 19D, the first inter-gate insulation layer 126 is formed between the dummy gate structures DGS. The source/drain region 130 may be covered with the first inter-gate insulation layer 126. The first inter-gate insulation layer 126 may include, e.g., a silicon oxide layer or a stack structure including a silicon insulation layer and a silicon nitride layer.

After that, the via hole VH penetrating through the cover insulation layer 112c and the first inter-gate insulation layer 126 and the first contact hole CH1 penetrating through the first inter-gate insulation layer 126 and exposing the source/drain region 130 are formed, and the via contact VC filled in the via hole VH and the first conductive plug CP1 filled in the first contact hole CH1 and electrically connected to the via contact VC are formed. In some embodiments, the via hole VH and the first contact hole CH1 may be separately and sequentially formed. In some other embodiments, the via hole VH and the first contact hole CH1 may be formed together.

The via contact VC and the first conductive plug CP1 may each include a conductive barrier layer and a conductive core layer covering the conductive barrier layer. The conductive barrier layer may include, e.g., Ti, Ta, TiN, TaN, or a combination thereof, and the conductive core layer may include, e.g., Co, W, or a combination thereof. In some embodiments, the via contact VC and the first conductive plug CP1 may be separately and sequentially formed. In some other embodiments, the via contact VC and the first conductive plug CP1 may be formed together.

The first conductive plug CP1 may extend in a direction crossing the plurality of fin-type active areas FA. For example, the first conductive plug CP1 may extend in the first horizontal direction (X direction). The first conductive plug CP1 may be electrically connected to the source/drain region 130. The via contact VC may electrically connect the first conductive plug CP1 to the buried rail 150. An upper surface of the first conductive plug CP1 may be at the fourth vertical level LV4.

The buried rail 150 is shown to be electrically connected to the first conductive plug CP1 connected to the source/drain region 130 formed in the first element region RX1 via the via contact VC, but one or more embodiments are not limited thereto. For example, the buried rail 150 and the via contact VC that are electrically connected to the first conductive plug CP connected to the source/drain region 130 formed in the second element region RX2 may be separately formed. Alternatively, for example, the buried rail 150 and the via contact VC may electrically connect the first conductive plug CP1 connected to the source/drain region 130 formed in the first element region RX1 to the first conductive plug CP1 connected to the source/drain region 130 formed in the second element region RX2.

The second inter-gate insulation layer 128 covering the source/drain region 130, the plurality of dummy gate structures (DGS of FIGS. 17A and 17B), and the insulation spacer 120 is formed. In order to form the second inter-gate insulation layer 128, an insulation layer covering the source/drain region 130, the plurality of dummy gate structures DGS, and the insulation spacer 120 to a sufficient thickness, and after that, the above resultant including the insulation layer may be planarized until the upper surface of the dummy gate capping layer D16 (see FIGS. 17A and 17B) may be exposed.

After that, the plurality of dummy gate structures DGS are removed. A wet-etching process may be performed to remove the plurality of dummy gate structures DGS. In the wet-etching process, an etching solution including, e.g., $HNO_3$, diluted fluoric acid (DHF), $NH_4OH$, tetramethyl ammonium hydroxide (TMAH), KOH, or a combination thereof may be used.

After that, the gate insulation layer 140 and a gate conductive layer may be formed in a space from which the plurality of dummy gate structures DGS are removed. Before forming the gate insulation layer 140, a process of forming an interfacial layer on a surface of the fin-type active area FA, which is exposed through the space where the plurality of dummy gate structures DGS are removed, may be formed. In order to form the interfacial layer, the fin-type active area FA exposed through the space where the plurality of dummy gate structures DGS are removed may be partially oxidized.

The gate insulation layer 140 and the gate conductive layer may be formed to cover an upper surface of the second inter-gate insulation layer 128 while filling in the space, from which the plurality of dummy gate structures DGS are removed. The gate insulation layer 140 and the gate conductive layer may be respectively formed by, e.g., an ALD process, a CVD process, a physical vapor deposition (PVD) process, a metal organic ALD (MOALD) process, or a metal organic CVD (MOCVD) process.

Unnecessary portions of the gate insulation layer 140 and the gate conductive layer are removed so as to expose the upper surface of the second inter-gate insulation layer 128, and the plurality of gate structures GS each including the gate insulation layer 140 and the gate line GL may be formed. The plurality of source/drain regions 130 may be located on the plurality of fin-type active areas FA at opposite sides of the plurality of gate structures GS.

The gate line GL may be formed to have an upper surface thereof at a lower level than the upper surface of the insulation spacer 120, and after that, a gate capping layer 142 may be formed in a space defined between a pair of adjacent insulation spacers 120. The gate capping layer 142 may cover the upper surfaces of the gate structures GS.

The gate insulation layer 140 may include a silicon oxide layer, a high-k dielectric layer, or a combination thereof. The high-k dielectric layer may include a material having a dielectric constant greater than that of the silicon oxide layer. The high-k dielectric layer may include metal oxide or metal oxynitride. The interfacial layer may include an oxide layer, a nitride layer, or an oxynitride layer.

The gate line GL may have a structure, in which a metal nitride layer, a metal layer, a conductive capping layer, and a gap-fill metal layer are sequentially stacked. The metal nitride layer and the metal layer may each include at least one of, e.g., Ti, Ta, W, Ru, Nb, Mo, and Hf. The gap-fill metal layer may include, e.g., a W layer or an Al layer. The gate line GL may include a work function metal containing layer. The work function metal containing layer may include at least one of, e.g., Ti, W, Ru, Nb, Mo, Hf, Ni, Co, Pt, Yb, Tb, Dy, Er, and Pd. In some embodiments, the gate line GL may include, e.g., a stack structure including TiAlC/TiN/W, a stack structure including TiN/TaN/TiAlC/TiN/W, or a stack structure including TiN/TaN/TiN/TiAlC/TiN/W, but is not limited thereto. The gate capping layer 142 may include, e.g., a silicon nitride layer.

After that, as shown in FIGS. 1A to 1C, the second contact hole CH2 penetrating through the gate capping layer 142 and exposing the gate line GL and the second conductive plug CP2 filled in the second contact hole CH2 and electrically connected to the gate line GL may be formed.

In some embodiments, the upper surface of the second inter-gate insulation layer 128, the upper surface of the gate capping layer 142, and the upper surface of the second conductive plug CP2 are at the fifth vertical level LV5 to configure a co-planar structure. The fifth vertical level LV5 may be higher than the fourth vertical level LV4. Therefore, the upper surface of the second conductive plug CP2 may be at a higher level than the upper surface of the first conductive plug CP1.

The external connection terminal 200 is attached to the rear wiring structure 180 exposed from the lower surface of the rear inter-wire insulation layer 170 to form the integrated circuit device 1. The external connection terminal 200 may include, e.g., a solder ball or a bump.

Figure 20:
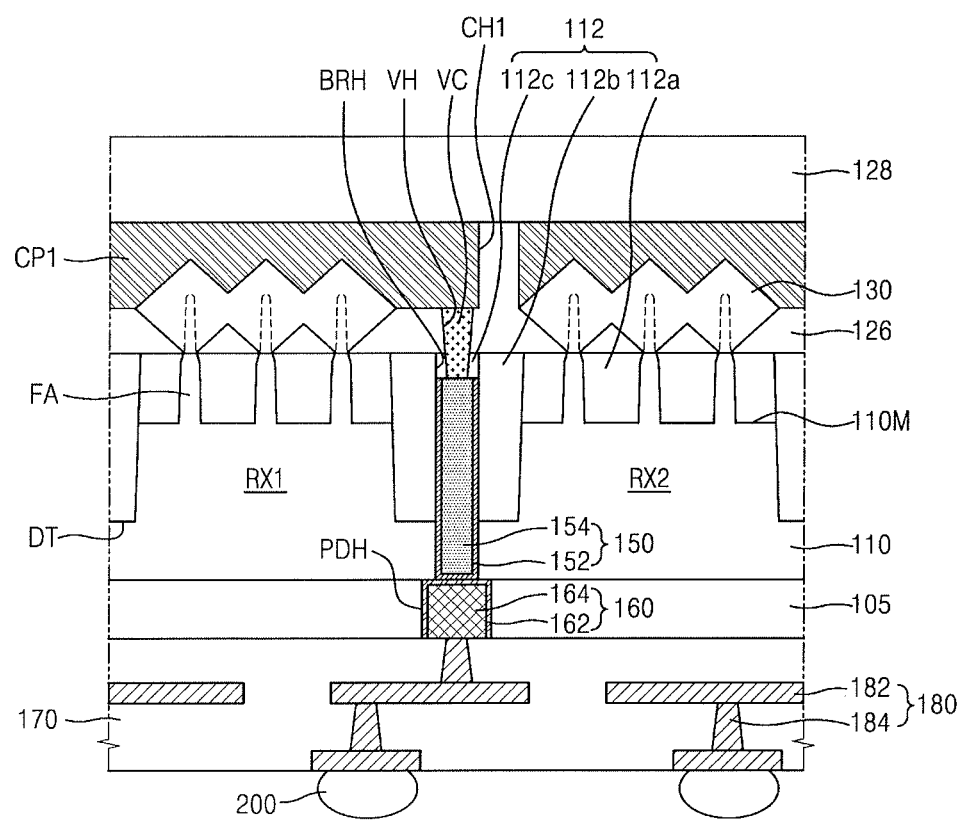
FIG. 20 illustrates a cross-sectional view of an integrated circuit device according to an embodiment.

FIG. 20 is a cross-sectional view of an integrated circuit device 1a according to an embodiment. FIG. 20 is a cross-sectional view taken along line X1-X1' of FIG. 1A, and descriptions provided above with reference to FIGS. 1A to 1C may be omitted.

Referring to FIG. 20, the integrated circuit device 1a may include the buried rail 150 and the power delivery structure 160 electrically connected to the buried rail 150. The lower surface of the buried rail 150 and the upper surface of the power delivery structure 160 may be at the same level as the upper surface of the embedded insulation layer 105. Therefore, the buried rail 150 extends to the embedded insulation layer 105 after penetrating through the separation insulation layer 112b and the semiconductor layer 110, but may not extend into the embedded insulation layer 105. The power delivery structure 160 may extend from the lower surface to the upper surface of the embedded insulation layer 105.

Figure 21:
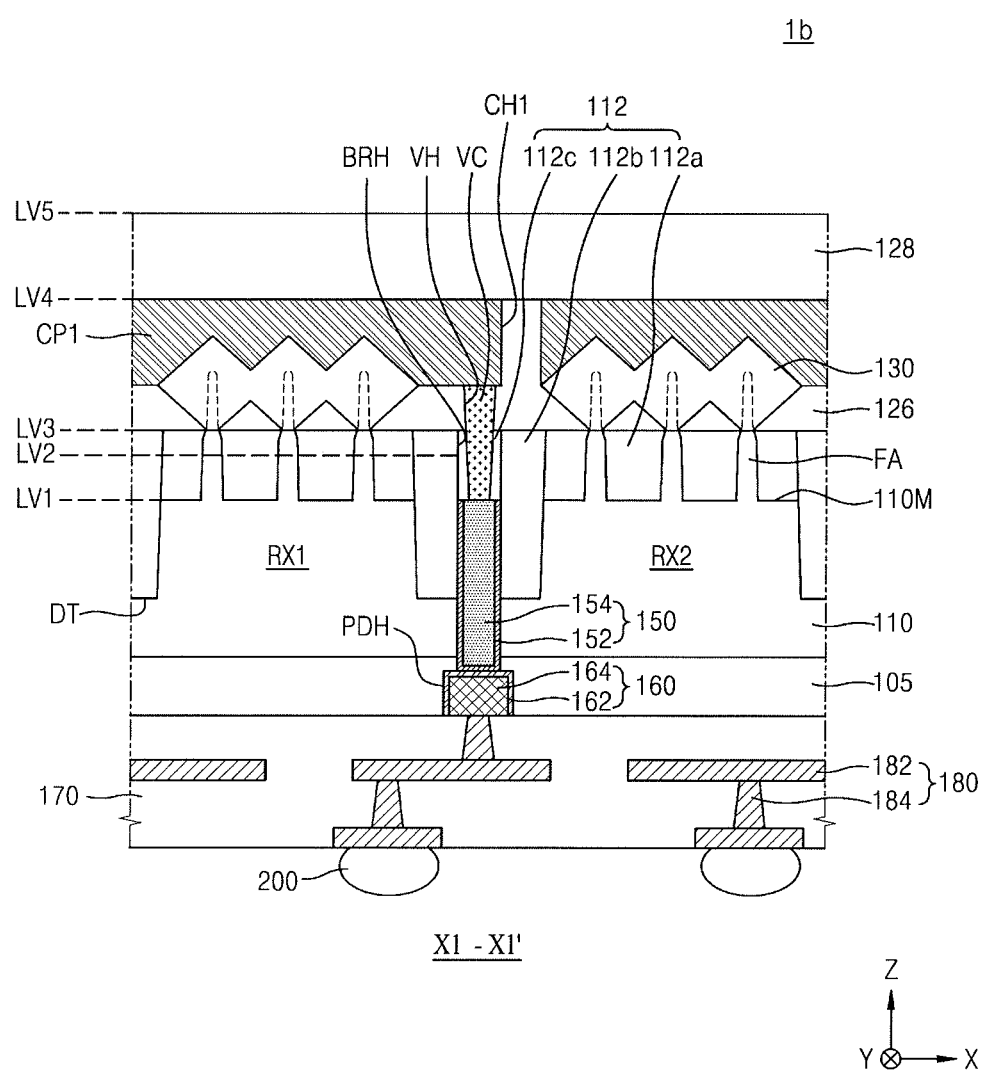
FIG. 21 illustrates a cross-sectional view of an integrated circuit device according to an embodiment.

FIG. 21 is a cross-sectional view of an integrated circuit device 1b according to an embodiment. FIG. 21 is a cross-sectional view taken along a portion corresponding to line X1-X1' of FIG. 1A, and descriptions provided above with reference to FIGS. 1A to 1C may be omitted.

Referring to FIG. 21, the integrated circuit device 1b may include the buried rail 150 and the power delivery structure 160 electrically connected to the buried rail 150. The upper surface of the buried rail 150 and the main surface 110M of the semiconductor layer 110 may be at the same level, i.e., the first vertical level LV1. Therefore, the lower surface of the via contact VC may be at the first vertical level LV1.

By way of summation and review, the present disclosure provides an integrated circuit device having a structure in which an electric power may be stably provided to the integrated circuit device even when a lot of wires and contacts are arranged in the integrated circuit device according to down-scaling of the integrated circuit device, and a method of manufacturing the integrated circuit device. That is, according to present disclosure, a semiconductor-on-insulator (SOI) wafer is used and a buried power rail (BPR) may be used as an alignment key in a process of forming a backside-power delivery network (BS-PDN), thereby preventing misalignment. In addition, the BPR and the BS-PDN may be directly connected without using a through silicon via (TSV), thereby improving the reliability in an electrical connection.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising:
   preparing a semiconductor-on-insulator (SOI) substrate, on which a base substrate layer, an embedded insulation layer, and a semiconductor layer are sequentially stacked;
   forming a deep trench that defines at least two element regions, by partially removing the semiconductor layer;
   forming a preliminary separation insulation layer to fill the deep trench;
   forming a buried rail hole that penetrates through the preliminary separation insulation layer and the semiconductor layer, a buried rail partially filled in a lower portion of the buried rail hole, and a preliminary cover insulation layer filled in an upper portion of the buried rail hole;
   exposing the embedded insulation layer by removing the base substrate layer; and
   forming a power delivery structure in the embedded insulation layer, the power delivery structure being in contact with the buried rail.

2. The method as claimed in claim 1, wherein a width of the buried rail in a direction between the at least two element regions is less than a width of the deep trench.

3. The method as claimed in claim 1, wherein forming the power delivery structure includes:
   forming a power delivery hole that exposes the buried rail, by partially removing the embedded insulation layer; and
   forming the power delivery structure that is filled in the power delivery hole,
   wherein the power delivery hole is formed by performing an etching process, in which the embedded insulation layer is partially removed by using a mask pattern as an etching mask, and
   wherein the mask pattern is obtained by a photolithography process in which the buried rail is an alignment key.

4. The method as claimed in claim 3, wherein the power delivery structure has a width in a direction between the at least two element regions, the width of the power delivery structure being greater than a width of the buried rail.

5. The method as claimed in claim 4, further comprising forming a rear wiring structure on a lower surface of the embedded insulation layer, which is opposite the semiconductor layer, and a rear inter-wire insulation layer partially surrounding the rear wiring structure, such that the rear wiring structure is electrically connected to the power delivery structure.

6. The method as claimed in claim 1, further comprising:
   forming a separation insulation layer and a cover insulation layer by partially removing the preliminary separation insulation layer and the preliminary cover insulation layer;
   forming a plurality of source/drain regions on the at least two element regions of the semiconductor layer;
   forming a via contact that is connected to the buried rail while penetrating through the cover insulation layer; and
   forming a first conductive plug on the plurality of source/drain regions, the first conductive plug electrically connecting the via contact to the plurality of source/drain regions.

7. The method as claimed in claim 6, further comprising:
   forming a gate structure on the semiconductor layer, the gate structure having a stack structure including a gate insulation layer and a gate line; and forming a second conductive plug that is electrically connected to the gate line while penetrating through a gate capping layer on the gate line.

8. The method as claimed in claim 7, wherein an upper surface of the second conductive plug is at a level higher than a level of an upper surface of the first conductive plug.

* * * * *